United States Patent [19]

Parrish

[11] 4,242,741

[45] Dec. 30, 1980

[54] FLOATING SHUNT SEISMIC AMPLIFIER

[75] Inventor: John F. Parrish, New Orleans, La.

[73] Assignee: Shell Oil Company, Houston, Tex.

[21] Appl. No.: 4,644

[22] Filed: Jan. 19, 1979

[51] Int. Cl.³ .............................................. G01V 1/38
[52] U.S. Cl. ...................................... 367/21; 330/258;
330/84; 333/12; 367/65; 367/135
[58] Field of Search .................... 330/84, 258; 367/20,
367/21, 135, 155, 177, 65; 333/12

[56] References Cited

U.S. PATENT DOCUMENTS

| | | | |
|---|---|---|---|
| 3,223,940 | 12/1965 | Early et al. | 330/84 |
| 3,469,255 | 9/1969 | Hoffman et al. | 307/109 |
| 3,566,298 | 2/1971 | Stevens | 330/84 |
| 3,939,468 | 2/1976 | Mastin | 367/65 |
| 4,088,961 | 5/1978 | Ashley | 330/84 |

OTHER PUBLICATIONS

"AF120 Generalized Impedance Converter", 1975, National Semiconductor Corp. Publication.

*Primary Examiner*—Howard A. Birmiel

[57] ABSTRACT

A differential amplifier circuit comprised of two operational amplifiers for use as a differential output and differential input amplifier for any two-terminal impedance transfer function. The input impedance is very low between the two input terminals, yet it is very high between either input terminal and the common or ground terminal, thus giving this amplifier many of the desirable characteristics of a transformer-coupled amplifier. High common mode voltage rejection ratios can be achieved even when moderate differential imbalances exist in the input and feedback networks due to the unique balancing feature of the circuit.

22 Claims, 26 Drawing Figures

$$\begin{bmatrix} I1 \\ I2 \end{bmatrix} = \begin{bmatrix} Y11 & -Y12 \\ -Y21 & Y22 \end{bmatrix} \begin{bmatrix} V1 \\ V2 \end{bmatrix}$$

FLOATING SHUNT SEISMIC AMPLIFIER

CROSS-REFERENCES TO RELATED APPLICATIONS

An amplifier having properties similar to one embodiment of the invention described herein is disclosed in copending application No. 004,638, dated Jan. 19, 1979. The amplifier of the copending application utilizes a lumped parameter equivalent of a hydrophone transmission line to provide signal compensation.

BACKGROUND OF THE INVENTION

This invention relates in general to linear differential input amplifiers with a low differential input impedance, which is defined as that impedance between the differential input terminals, and a high common mode impedance, which is defined as that impedance between either input terminal and the common, ground, or reference terminal of an electrical network. Due to the high common mode impedance, such amplifiers can be used to measure the current or charge transfer through a branch of an electrical network without charging the impedances or voltages that would be observed if the amplifier were replaced by a floating shunt between the amplifier input nodes. In particular, the invention can be used as a direct current (DC) amplifier for the differential current or charge at the output of a two conductor transmission line attached to a circuit or transducer that has a balanced or unbalanced impedance or an unknown potential with respect to the common, ground, or reference terminal.

A short piece of insulated wire is one practical representative of an ideal floating shunt. In order to function as a floating shunt amplifier there must be some means of generating an output which is a function of the current through the wire. For example, the wire can be replaced by the primary winding of a coupling transformer, thereby achieving a relatively low differential input impedance together with a relatively high common mode impedance and reasonably good isolation between the common mode voltages at the primary and secondary sides of the transformer. However, certain disadvantages which will be later explained, are present when a transformer is utilized.

A particularly useful application of a floating shunt amplifier exists in the field of seismic surveying. Seismic surveys are generally conducted with remote transducer stations that are connected to a survey recording instrument via a seismic cable. A transducer station consists of either an individual transducer or of an array of transducers connected together with a coupling network. The transducers respond to sound waves by converting some aspect of acoustic wave propagation into electrical information. Typically this information is an output voltage which is proportional to the local acoustic pressure for hydrophone transducers, the local particle velocity for geophone transducers, or the local particle acceleration for accelerometer transducers. The seismic cable is used to conduct the electrical information from the transducer to the survey recording instrument and may include strain cables, structural spacers, mechanical connectors, protective jackets, transformers, coupling devices, equalization networks, electrical leads, and electrical connectors. In one commonly used form of seismic cable, some of the electrical leads are twisted pair transmission lines called cable pairs. Each transducer station is coupled through its own cable pair to an input amplifier stage of a particular channel of the survey recording instrument. The cable pair length can vary considerably from one transducer station to another. For example, on one marine survey vessel the cable pair length from the survey recording instrument to the nearest station is 775 feet, while that to the farthest staton is 12,695 feet. For a land seismic survey typical cable pair lengths may range from 80 feet to 19,200 feet.

Due to physical limitations, a transducer station does not behave like an ideal voltage source but manifests a finite source impedance. Likewise, each cable pair exhibits both series and shunt impedance distributed along the entire length of the transmission line. These impedance characteristics cause the electrical signal from the transducer station to undergo a frequency selective absorption and phase shift that varies with the length of the transmission line. Consequently, the electrical signal that is coupled to the input amplifier stage of the survey recording instrument is a distorted replica of the signal which is transmitted from the transducer station. Moreover, even if the transducer stations transmit identical signals, the input amplifier stages will receive an electrical signal which varies with the cable pair length between the transducer station and the survey recording instrument.

Some of the signal distortion can be alleviated by reducing either the source impedance or the load impedance attached to the transmission line. Transformers, for example, have been used with varying degrees of success to lower the source or the load impedance. However, when used to lower the source impedance, the transducer station output voltage is thereby reduced which can make the effect of Johnson noise or other noise voltages more serious. Even when used to lower the load impedance, transformers are not always desirable for use in a multiple channel seismic survey recording instrument for numerous reasons. For instance, even a well designed transformer will distort the signal at very low frequencies, the transformers in a multiple channel instrument may have to be oriented with respect to one another in order to minimize mutual coupling, magnetic transformers can be sensitive to external magnetic field pickup such as from power distribution lines, and transformers designed for the low frequencies used in seismic surveys tend to be heavy, bulky and expensive.

When the source impedance of the transducer station is capacitive such as for a crystal hydrophone transducer, another method of reducing the load impedance has been the use of differential charge amplifier, typified by U.S. Pat. No. 3,939,468 issued to Mastin. Two single-ended operational amplifier circuits each having identical parallel capacitive-resistive feedback loops are used to form a balanced differential charge amplifier stage which is coupled to a differential voltage amplifier stage. The circuit has a very low differential input impedance, thereby reducing the effects caused by the shunt impedance between the cable pair conductors. A high common mode rejection ratio is achieved by using the differential voltage amplifier to cancel the balanced common mode charge response from the differential charge amplifier stage.

The low differential input impedance of this amplifier reduces the effect of the total shunt impedance by maintaining the two input terminals at approximately the same potential, thereby allowing only a small differential voltage and hence very little current flow through the distributed shunt capacitance or other shunt impedances between the cable pair conductors. However, it does not compensate for the series impedance of the cable pair nor does it compensate for the residual effects of the distributed shunt impedance. Consequently, within the seismic survey frequency band, the output voltage of the charge amplifier circuit is proportional to the output of the transducer station only for moderately short transmission lines. The signal amplitude and phase responses change as the frequency and distance increase.

The variation in the amplitude and phase responses could be reduced by the addition of passive equalization networks to each cable pair, thus making the transfer function for each station approximately the same as that of the station with the longest transmission line. However, even after the transfer functions are equalized, subsequent filtering or digital data processing would be needed in order to obtain a flat, zero-phase shift response within a desired frequency passband.

Another difficulty with the Mastin circuit is that it has a very low common mode impedance between either input terminal and the common or ground terminal. As taught by Elio Poggiagliolmi (Slashes on Seismic Records, in IEEE Transactions on Geoscience Electronics, Vol. GE-15, No. 4, Oct. 1977, pp. 215–227.) each of the cable pairs in the seismic cable acts as an antenna for very low frequency (VLF) electromagnetic radiation such as that generated by thunder storms. This VLF antenna has a low radiation impedance with respect to the ground; consequently, the higher the common mode impedance the less energy is transferred into the amplifier. It follows that seismic instruments would be less sensitive to electromagnetic pickup if they could be isolated from the ground.

Another type of balanced charge amplifier circuit has been proposed by Hoffman, et al, in U.S. Pat. No. 3,469,255. An auxilliary circuit is used to effect a balanced sink for the common mode charge transfer so that the output of a single-ended type of charge amplifier can respond to only the differential charge transfer. The Hoffman circuit also exhibits a low differential input impedance and a low common mode impedance. Both the Mastin circuit and the Hoffman circuit shunt the common mode charge to ground through a very low impedance, hence both would be sensitive to VLF electromagnetic radiation as described by Poggiagliolmi. Their rejection of the common mode charge response depends upon equal impedances in both halves of the input circuit and of the feedback circuit.

In order to raise the common mode impedance of either of the above circuits, it is necessary to use additional circuitry. For example, a balance input isolation transformer will effect a high common mode impedance together with a low differential input impedance but it will also introduce the previously discussed disadvantages of coupling transformers. In some cases, it is practical to design an auxilliary circuit to make the voltage at the internal common terminal of the amplifier circuit equal to the external common mode voltage of the cable pair. Alternatively, the entire amplifier circuit including all power supplies can be insulated from the external common or ground. Both of these approaches have been used for certain types of instrumentation but they are not satisfactory solutions for a multiple channel seismic survey recording instrument because each amplifier circuit would have to be totally isolated from the common or ground terminal and from all of the other amplifier circuits. Consequently, a multitude of separate power supplies or external circuits would be required.

SUMMARY OF THE INVENTION

The present invention solves the above problems by providing a direct current (DC), low impedance, floating shunt, differential amplifier. Two operational amplifiers are combined to form a single differential amplifier with a transfer impedance response function, such as a current-to-voltage converter or a charge-to-voltage converter. The circuit exhibits a very low differential input impedance between the two input terminals, together with a relatively high common mode impedance between either input terminal and the common, ground, or reference terminal. It is a substantial improvement over similar amplifiers because this combination of input impedances is achieved without the use of input coupling transformers, isolated power supplies, or auxiliary circuits.

The transfer impedance response function of the low impedance, floating shunt amplifier can be converted into a voltage gain response function by connecting the low impedance differential input terminals to a pair of output terminals from an input electronic network that has a known transfer admittance response function with respect to a selected pair of input terminals of the electronic network. The resulting floating shunt voltage amplifier will have a voltage gai response function equal to the complex product of the transfer admittance of the input electronic network and the transfer impedance of the floating shunt amplifier. The differential input impedance of this floating shunt voltage amplifer is approximately equal to the reciprocal of the driving-point admittance of the input terminals of the input electronic network when its output terminals are short-circuited.

The outputs of this invention can be connected to the inputs of a differential voltage amplifier stage that has a high common mode voltage rejection ratio. The resulting single-ended output will respond to only the differential input signal because the balanced common mode response of the inventioncauses the common mode signals to be completely cancelled within the precision of the component operational amplifiers. Moreover, the common mode rejection is almost independent of the balance with respect to ground or of the matching between the two halves of the input or feedback networks that determine the overall differential response function.

One particular embodiment of the invention results in an improved seismic amplifier which is fully compensated for losses in the transmission line betwwen a remote transducer station and the survey recording instrument. In order to provide within a desired frequency passband a flat, zero-phase-shift response function from the signal voltage generated at a transducer to the output voltage of the seismic amplifier, the two-terminal feedback loops of the basic floating shunt amplifier are replaced by feedback networks that effect a transfer admittance function that is proportional to the transfer admittance of the transmission line when combined with the source impedance of the transducer station. Some of the theory underlying the design of this feedback circuit is described more fully in copending application Ser. No. 004,638, dated Jan. 19, 1979.

BRIEF DESCRIPTION OF THE DRAWINGS

Other advantages and capabilities of the present invention will become apparent from the following detailed description of the preferred embodiments when taken in conjunction with the attached drawing in which.

DESCRIPTION OF THE PREFERRED EMBODIMENTS

Figure 1:
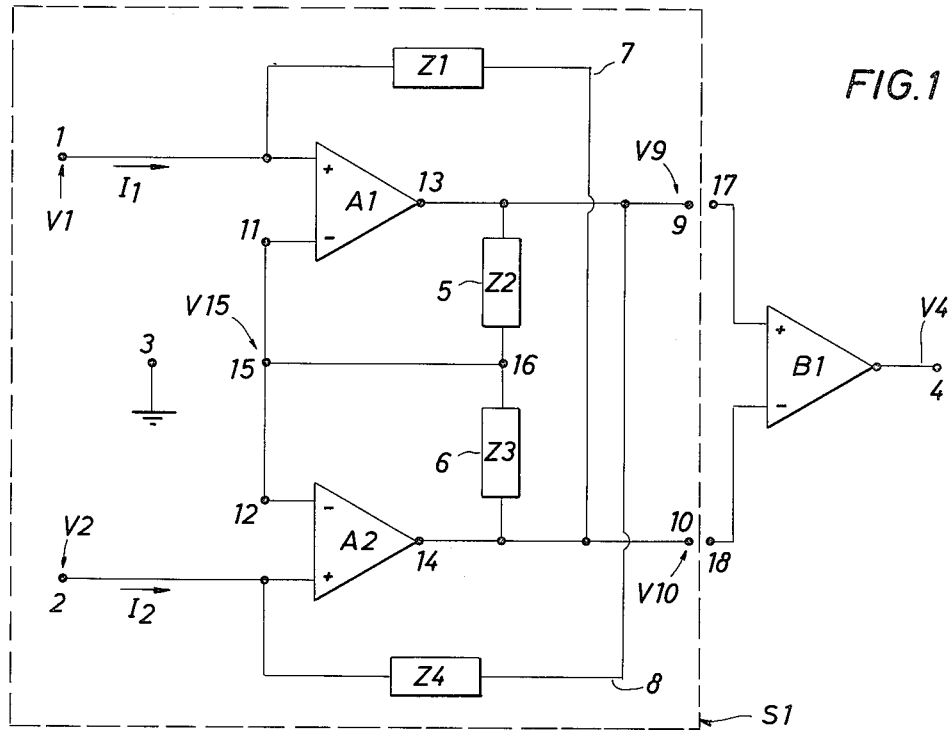
FIG. 1 is a simplified schematic of the basic floating shunt amplifier.

Referring to FIG. 1, a basic floating shunt amplifier S1 is shown in schematic form, represented by operational amplifiers A1 and A2 interconnected to form a two-terminal input, two-terminal output amplifier. In order to identify the invention more clearly, the schematic has been simplified by omitting the power supplies, bias circuits, and other components, terminals, and wiring that do not directly affect the relationships between the input and the output signals. Amplifiers A1 and A2 have positive polarity inputs 1 and 2 respectively and negative polarity inputs 11 and 12 respectively. The outputs of amplifiers A1 and A2 are designated 13 and 14 respectively. Positive inputs 1 and 2 provide the external inputs of amplifier S1. Operational amplifiers A1 and A2 are interconnected through the positive and negative polarity inputs as follows: Feedback loop 5 electrically connects output 13 of amplifier A1 to its negative polarity input 11. Similarly, output 14 of amplifier A2 is connected to its negative polarity input 12 by means of feedback loop 6. Feedback loops 5 and 6 share a common branch from node 15 to node 16. Feedback loop 7 electrically connects output 14 of amplifier A2 to the positive polarity input 1 of amplifier A1. Similarly, output 13 of amplifier A1 is connected to the positive polarity input 2 of amplifier A2 by means of feedback loop 8. The external outputs of amplifier S1 are designated as 9 and 10 and are connected to outputs 13 and 14 of amplifiers A1 and A2 respectively. Terminal 3 serves as a common, ground, or reference terminal for defining the voltages at the various external and internal nodes of amplifier S1.

In this configuration, the first terminals of impedances Z2 and Z3 are connected in common at node 16, the second terminal of impedance Z2 being connected to output 13 of amplifier A2, the second terminal of impedance Z3 being connected to output 14 of amplifier A2. Impedances Z1 and Z4 are placed in feedback loops 7 and 8 respectively. In order to function as a floating shunt amplifier with a high common mode input impedance and low differential input impedance, the complex frequency-dependent product of the values of the impedances of Z1 and Z2 must be equal to the product of the values of Z3 and Z4 within the engineering tolerances of the circuit. Subject to this constraint, changing the forms of these four impedances will change the functions for which amplifier S1 may be used. These functions will be described in more detail below.

The current and voltage relationships associated with the floating shunt amplifier circuit will illustrate the utility of the invention. Referring again to FIG. 1, with all voltages measured with respect to ground potential at terminal 3, and assuming that amplifiers A1 and A2 are ideal operational amplifiers with infinte gain and infinite input impedances at both positive and negative input terminals: for any configuration of amplifier S1 which has a stable output, $V1-V15=0$ and $V2-V15=0$. Consequently, $V1=V2=V15=VCM$, where VCM is defined as the common mode voltage at terminals 1 and 2. Since all of the current which flows into terminal 1 must flow through impedance Z1, then $V10=VCM-I1\cdot Z1$ or $(V10-VCM)=-I1\cdot Z1$. Likewise, $(V9-VCM)=-I2\cdot Z4$. In a similar manner, all of the current which flows through impedance Z2 must also flow through impedance Z3. Therefore, $(V9-VCM)/Z2=-(V10-VCM)/Z3$. Combining these three equations and eliminating V9, V10, and VCM: $-(I2\cdot Z4)/Z3$ or $I2=-I1\ ((Z1\cdot Z2)/(Z3\cdot Z4))$. Thus, all of the current which flows into terminal 1 will appear to flow out of terminal 2 whenever $(Z1\times Z2)$ is equal to $(Z3\times Z4)$. In that case the common mode current, defined as $ICM=(I1+I2)$ will be zero and no common mode current will flow regardless of the value of the common mode voltage VCM. In other words, the common mode input impedance must be infinite. Moreover, since $V1=V2$ and $I1=-I2$, the differential input impedance of amplifier S1 will be negligible. With respect to its input terminals 1 and 2, amplifier S1 in FIG. 1 behaves just like an ideal floating shunt and could be replaced by a short piece of insulated wire connecting the two terminals 1 and 2. However, amplifier S1 is also a basic form of floating shunt amplifier because it generates output voltages at terminals 9 and 10 which are functions of the differential input current flowing through its input terminals.

It is also possible to solve the network equations associated with FIG. 1 after replacing the ideal operational amplifier model assumed above with a more accurate model of a real operational amplifier. The resulting formulas are somewhat more complicated and obscure the invention being exemplified herein. Moreover, the fractional change in the formulas that relate the input voltages and currents to the output voltages and currents is typically on the order of the reciprocal of the gains of the operational amplifiers A1 and A2. Since the gain of a real operational amplifier is usually much larger than unity within the desired frequency passband, the formulas presented above are often more accurate than the engineering tolerances of the components used in the feedback loops. However, it is instructive to state more accurate formulas for the differential and common mode input impedances of the circuit described in FIG. 1 when the operational amplifiers have large finite gains G1 and G2 respectively for amplifiers A1 and A2. Defining driving point impedance ZD as the differential input impedance between terminals 1 and 2 of FIG. 1 and assuming that VCM=0 and that both G1 and G2 are much larger than unity:

$$ZD \approx Z1/G2 + Z4/G1$$

In a similar manner, defining driving point impedance ZC as the common mode input impedance of terminals 1 and 2 with respect to ground at terminal 3 of FIG. 1 and assuming both G1 and G2 are much larger than unity:

$$ZC \approx \tfrac{1}{2} G1 \cdot G2(Z1 \cdot Z2 + Z3 \cdot Z4)/(G1 \cdot Z3 + G2 \cdot Z2)$$

In other words, the common mode input impedance is finite and directly proportional to the gains of the operational amplifiers whereas the differential input impedance is finite and inversely proportional to the same gains.

The common mode voltage response of the basic floating shunt amplifier can be eliminated by cascading amplifier S1 with a differential voltage amplifier B1 that has a high common mode voltage rejection ratio. Amplifier B1 will generate a single output voltage at terminal 4 which is proportional to the difference between the voltage at positive input terminal 17 and the voltage at negative input terminal 18. When terminals 17 and 18 of amplifier B1 are connected to terminals 9 and 10 respectively of amplifier S1, then the output at terminal 4 will no longer respond to the common mode voltage VCM. The output voltage becomes $V4 = I1(Z1+Z4)$, where GB is the voltage gain of amplifier B1. It is also possible to generate outputs that are proportional to either $I1 \cdot Z1$ or to $I1 \cdot I4$ separately by applying the common mode voltage VCM to one of the input terminals of amplifier B1. For example, if the input impedance at terminal 18 of amplifier B1 is sufficiently high that it may be connected to terminal 15 without appreciably affecting the currents through Z2 and Z3, then terminal 17 may be connected to terminal 9 and the output at terminal 4 becomes $V4 = I1 \cdot Z4 \cdot GB$. Alternatively, when terminal 17 is connected to terminal 10 while terminal 18 is connected to 15, then the output voltage at terminal 4 becomes $V4 = -I1 \cdot Z \cdot GB$. Likewise, by connecting terminals 15 and 3 of amplifier S1 to the high impedance input terminals of a buffer amplifier such as amplifier B1, an output voltage that is equal to or proportional to the common mode voltage VCM can be generated independently of the value of the input current I1.

Figure 2:
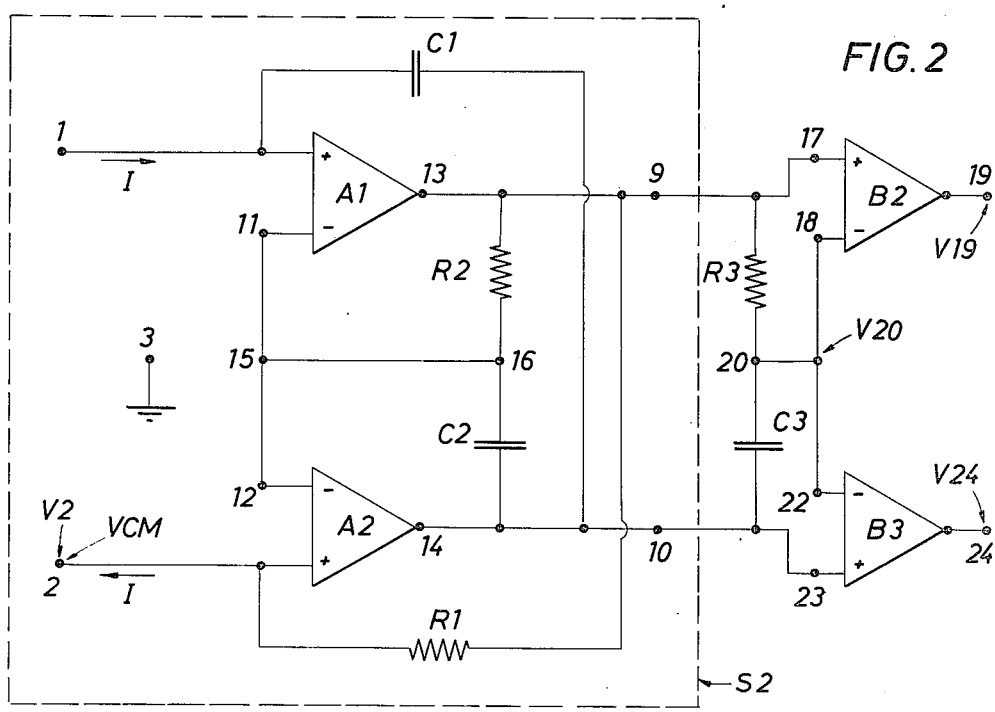
FIG. 2 is a simplified schematic of a floating shunt amplifier with two unbalanced outputs proportional to current and charge.

A more specific embodiment of the basic floating shunt amplifier of FIG. 1 is shown in FIG. 2.

Impedances Z1, Z2, Z3 and Z4 of amplifier S1 in FIG. 1 have been replaced in FIG. 2 by capacitance C1, resistance R2, capacitance C2 and resistance R1, respectively. Terminal designations shown for amplifier S1 or FIG. 1 are similarly designated for amplifier S2.

In order that the current I flowing into terminal 1 be equal to the current flowing out of terminal 2, the impedance of C1 times the impedance of R2 must be equal to the impedance of C2 times the impedance of R1. Equivalently, the time constant R1 times C1 must be equal to the time constant of R2 times C2. Common mode voltage VCM will appear at terminals 1, 2 and 15. The difference in voltage between V9 and VCM is proportional to the differential input current I, with constant of proportionality R1. The difference in voltage between V10 and VCM is proportional to the time integral of the differential input current I, with constant of proportionality $-1/C1$.

The common mode voltage response of amplifier S2 can be eliminated by cascading amplifier S2 with differential voltage amplifiers B2 and B3 that have high common mode voltage rejection ratios. The outputs of amplifiers B2 and B3 are designated 19 and 24 respectively. The amplifiers B2 and B3 have positive polarity inputs 17 and 23 respectively and negative polarity inputs 18 and 22 respectively. A resistance R3 is connected from positive polarity input 17 of amplifier B2 to circuit node 20. A capacitance C3 is connected from positive polarity input 23 of amplifier B3 to circuit node 20. Circuit node 20 is connected to both of the negative polarity inputs 18 and 22. If time constant $(R3 \times C3)$ is made equal to time constant $(R1 \times C1)$ then V2 will be equal to VCM when outputs 9 and 10 of amplifier S2 are connected respectively to inputs 17 and 23 of amplifiers B2 and B3. Output 19 of amplifier B2 is then proportional to the differential input current I. Output 24 of amplifier B3 will be proportional to the time integral of the differential input current I. Equivalently, output 24 of amplifier B3 is proportional to the electric charge transferred through the differential input terminals 1 and 2 of floating shunt amplifier S2. Amplifier S2 with the buffer amplifiers B2 and B3 shown in FIG. 2 has particular applications whenever a voltage function and its integral are required simultaneously. The input terminals 1 and 2 are isolated from the ground terminal by an infinite common mode impedance yet the differential input impedance between the input terminals is negligible. Current or charge can flow from terminal 1 to terminal 2 without a voltage drop between the terminals.

In many applications it is desirable for an amplifier to generate complimentary outputs such that an increase in the voltage at one output terminal is balanced by an equal but opposite change in the other output voltage. For instance, one means of reducing radiation from a transmission line involves driving the transmission line with such a balanced output signal. The basic floating shunt amplifier S1 in FIG. 1 can be configured as a balanced output floating shunt amplifier by further constraining the four impedance values so that $Z1=Z4$ and $Z2=Z3$. Clearly, $Z1 \cdot Z2 = Z3 \cdot Z4$ as previously required. In addition: $(V9-VCM)=(V10-VCM)=I1 \cdot Z1$. The output voltages at terminals 9 and 10 are complimentary with respect to a reference potential equal to VCM. By connecting the input terminals 17 and 18 of a buffer amplifier like B1 in FIG. 1 to the output terminals 9 and 10 of amplifier S1, a single-ended output voltage can be generated at output terminal 4 which is proportional to the difference in the voltages at terminals 9 and 10 and independent of the common mode voltage VCM. Likewise, by connecting the output terminals 9 and 10 of a balanced output configuration of amplifier S1 to the positive input terminals 17 and 23 of a pair of buffer amplifiers like B2 and B3 in FIG. 2, a pair of complimentary single-ended outputs can be generated at output terminals 19 and 24, provided that impedances R3 and C3 are replaced by another circuit which maintains circuit node 20 in FIG. 2 at the same potential as VCM. Alternatively, if the common mode voltage VCM can be made equal to zero as found at terminal 3, such as by connecting together terminals 2 and 3, then the values of the output voltages at terminals 9 and 10 of a balanced output configuration of amplifier S1 will be equal in magnitude and opposite in sign without the use of additional buffer amplifiers.

Figure 3A:
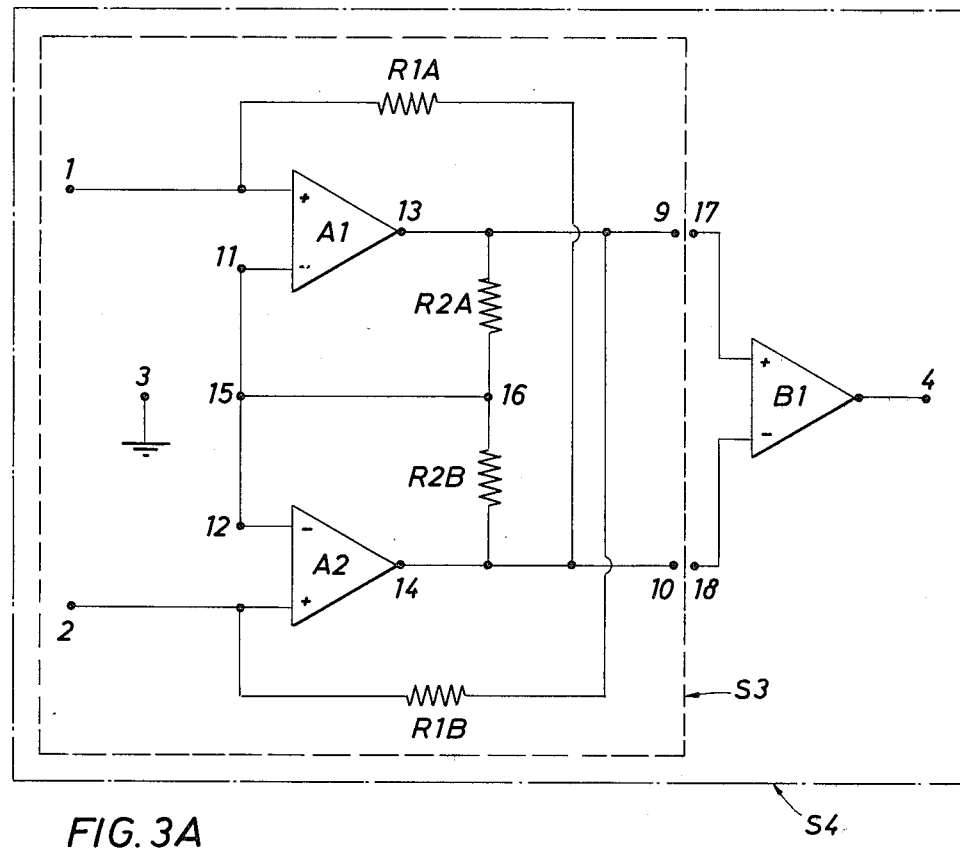
FIG. 3A is a simplified schematic of a floating shunt current-to-voltage converter.

One embodiment of a floating shunt amplifier is a current-to-voltage converter as shown in FIG. 3A. The feedback configuration of amplifier S3 shown in FIG. 3A is identical to that shown for amplifier S1 in FIG. 1, but resistances R1A, R2A, R2B and R1B are substituted for impedances Z1, Z2, Z3 and Z4 of FIG. 1 respectively. It is possible to select $R1A=R1B$ and $R2A=R2B$ so that the output voltages will be complementary with respect to VCM. A single-ended output, floating shunt, current-to-voltage converter S4 in FIG. 3A can be formed by cascading amplifier S3 with amplifier B1 in order to eliminate the common mode voltage response and generate a single-ended output at terminal 4 which is proportional to the differential input current flowing into terminal 1 and out of terminal 2. The constant of proportionality which expresses the output voltage in terms of the input current may be called the transfer resistance of the amplifier S4 and it is equal to the voltage gain of amplifier S3 times the sum of resistances R1A and R1B. An important feature of current-to-voltage converter S4 is that input terminals 1 and 2 are isolated from the ground terminal 3 by an infinite common mode input impedance. Moreover, the current can flow from terminal 1 to terminal 2 without a voltage drop, since the input terminals behave as if they were connected together with a short piece of insulated wire.

Figure 3B:
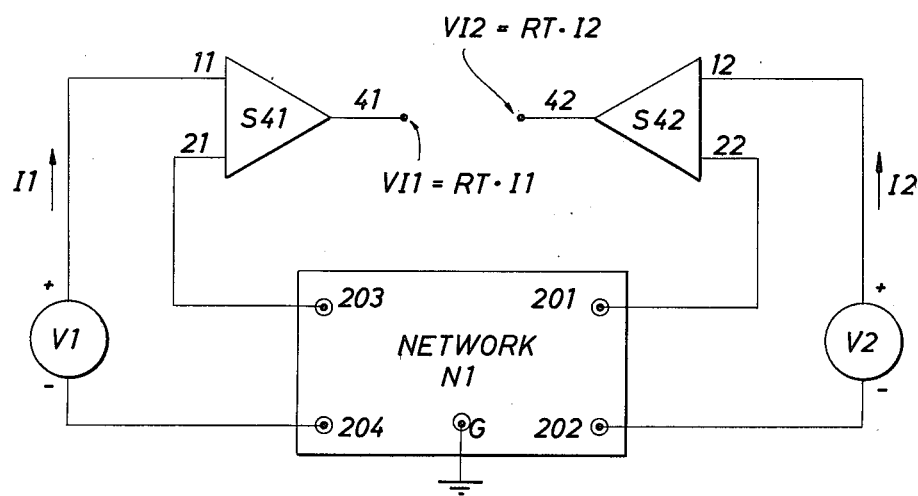
FIG. 3B is a circuit utilizing a current-to-voltage converter of the invention for measuring various network parameters.

As a result of this combination of input impedances, amplifier S4 can be applied very simply, as shown in FIG. 3B, in order to measure the admittance matrix values of an electrical network. Network N1 has a pair of terminals 203 and 204 which may be called the input pair. Another pair of terminals, 201 and 202 may be called the output pair. Terminal G serves as a reference terminal and it is not necessarily connected to an internal or external node of network N1. Although in the following discussion a ground terminal is not always referred to, it is implicitly understood that all voltages mentioned are with respect to a circuit ground, unless otherwise specifically noted. As taught by E. Brenner and M. Javid in Analysis of Electric Circuits (McGraw-Hill Book Company, Inc., New York, 1959) such networks are known as two-terminal pair networks or two-port networks. The principle of superposition holds true if the network is composed of linear elements. In order to measure the admittance matrix, terminals 203 and 204 are connected together with a zero impedance branch comprised of a first voltage source V1 in series with a first current sensor S41. For the configuration shown in FIG. 3B, the negative terminal of voltage source V1 is connected to terminal 204 of network N1. The positive terminal of voltage source V1 is connected to terminal 11 of the first current sensor S41. Terminal 21 of S41 is connected to terminal 203 of network N1. Likewise, terminal pair 201 and 202 of network N1 are connected together with a zero impedance branch comprised of voltage source V2 in series with a second current sensor S42. The negative terminal of voltage source V2 is connected to terminal 202 of network N1. The positive terminal of voltage source V2 is connected to terminal 12 of current sensor S42. Terminal 22 of S42 is connected to terminal 201 of network N1. The current sensors S41 and S42 are current-to-voltage converters similar to S4 as discussed previously. Terminals 11 and 12 of S41 and S42 in FIG. 3B serve the same function as terminal 1 of S4 in FIG. 3A. In a like manner, it is possible to group the functions of terminals 21 and 22 in FIG. 3B with terminal 2 in FIG. 3A. Output voltages are generated at output terminals 41 and 42 of current sensors S41 and S42 respectively. These outputs are similar to output 4 in FIG. 3A and they are proportional to the input currents I1 and I2 respectively. Parameter Y11 is the ratio of current I1 divided by voltage V1 and $V2=0$ and is known as the driving point admittance of network terminal pair 203 and 204 when a zero impedance branch connects together terminals 201 and 202. The ratio of current I2 divided by the negative of voltage V1 and $V2=0$ is known as the transfer admittance, Y21, of terminal pair 201 and 202 with respect to terminal pair 203 and 204. Likewise, Y22 is the ratio of current I2 divided by voltage V2 when $V1=0$ and is known as the driving point admittance of network terminal pair 201 and 202 when a zero impedance branch connects together terminals 203 and 204. The ratio of current I1 divided by the negative of voltage V2 when $V1=0$ is known as the transfer admittance, Y12, of terminal pair 203 and 204 with respect to terminal pair 201 and 202. Since the voltage sources and the current sensors in FIG. 3B are all isolated from the ground and from each other, it is not necessary to know the explicit relationship between ground terminal G and the rest of the network and test circuit. Moreover, the short-circuit admittance matrix is not the only way of describing the responses of a two-terminal pair network. For example, the open circuit impedance representation can be derived from the short circuit admittance representation.

Figure 4A:
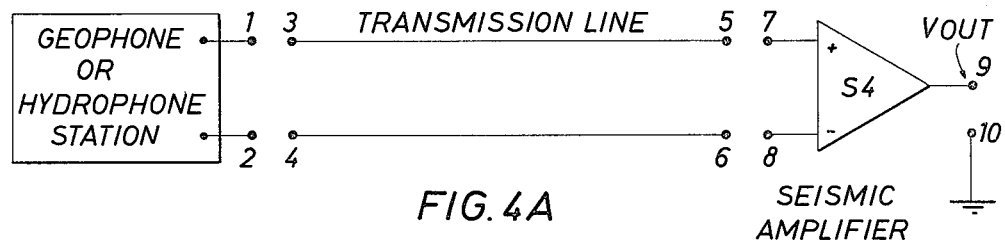
FIG. 4A is a simplified schematic of a geophone or hydrophone station attached to a seismic amplifier through a transmission line.
Figure 4B:
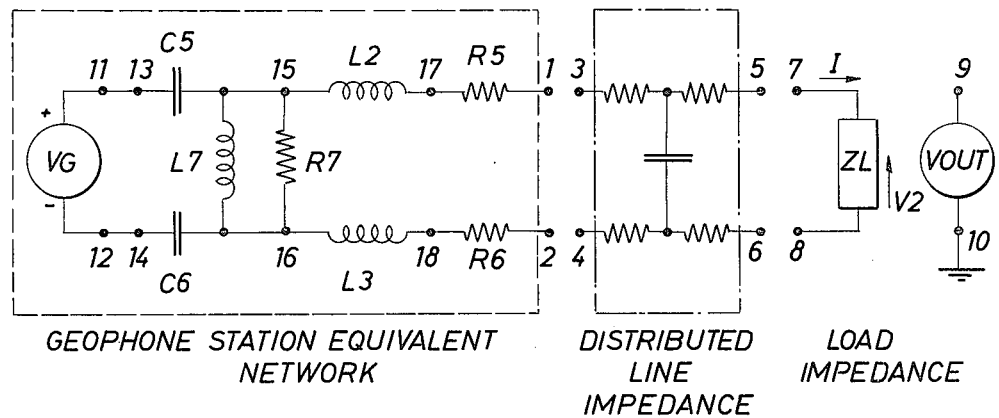
FIG. 4B is an equivalent electrical circuit for the schematic of FIG. 4A.

A current-to-voltage converter like S4 in FIG. 3A can also be used as an input amplifier in a seismic survey recording instrument. Referring to FIG. 4A, a geophone station comprised of one or more geophone transducers and a coupling network generates an output voltage at terminals 1 and 2 which are connected respectively to terminals 3 and 4 at the input of a transmission line contained within a seismic cable. Terminals 5 and 6 are the output terminals of the transmission line and they are connected respectively to the input terminals 7 and 8 of a seismic amplifier S4 which generates an output voltage at terminal 9. Terminal 10 is the ground or reference terminal for the seismic survey recording instrument. Terminals 1 and 2 in FIG. 4A can be associated with an equivalent electrical network as shown in FIG. 4B. In a typical field configuration the equivalent network of the geophone station can be represented by an ideal voltage source, VG, which is directly proportional to the local particle velocity, cascaded with a balanced two-port network. For the configuration represented in FIG. 4B, the positive terminal 11 of the ideal voltage source is connected to node 13 while the negative terminal 12 of the ideal voltage source is connected to node 14. A capacitor C5 connects nodes 13 and 15. Another capacitor C6 with the same capacitance as C5 connects nodes 14 and 16. A parallel combination of an inductor L7 and a resistor R7 is connected between nodes 15 and 16. Inductor L2 is connected between nodes 15 and 17, and another inductor L3 is connected between nodes 16 and 18. Resistor R5 connects node 17 with output terminal 1, and resistor R6 connects node 18 with output terminal 2 of the geophone station equivalent network. Typical values for a given field configuration are: C5, C6=3.6 microfarad, L7=220.8 Henry, R7=9600 ohm, L2, L3=0.02 Henry, R5, R6=1440 ohm. The transmission line between terminal pair 3 and 4 and terminal pair 5 and 6 is a distributed network and can be represented most accurately by describing the relationships among the input and output voltages and currents as discussed for network N1 in FIG. 3B. Such a description of a transmission line can be found in standard textbooks such as *Alternating-Current Circuits* by K. Y. Tang. (The International Textbook Company, Scranton, Pa., 1940. For frequencies below a few tens of kilohertz a typical transmission line used for seismic surveys has a distributed series resistance of 0.066 ohms/foot, a distributed shunt capacitance of 50 picofarads/foot, and negligible values for the distributed shunt conductance and the distributed series inductance. For a typical voltage amplifier used in a seismic survey recording instrument, the load impedance between terminals 7 and 8 is 20000 ohms and VOUT is proportional to V2, the voltage difference between terminals 7 and 8.

Figure 5A:
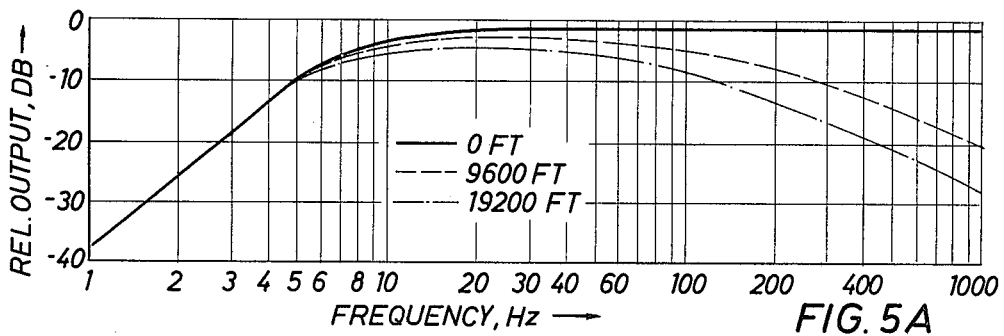
FIGS. 5A and 5B are the amplitude and phase responses, respectively, of a conventional geophone transmission circuit.
Figure 5B:
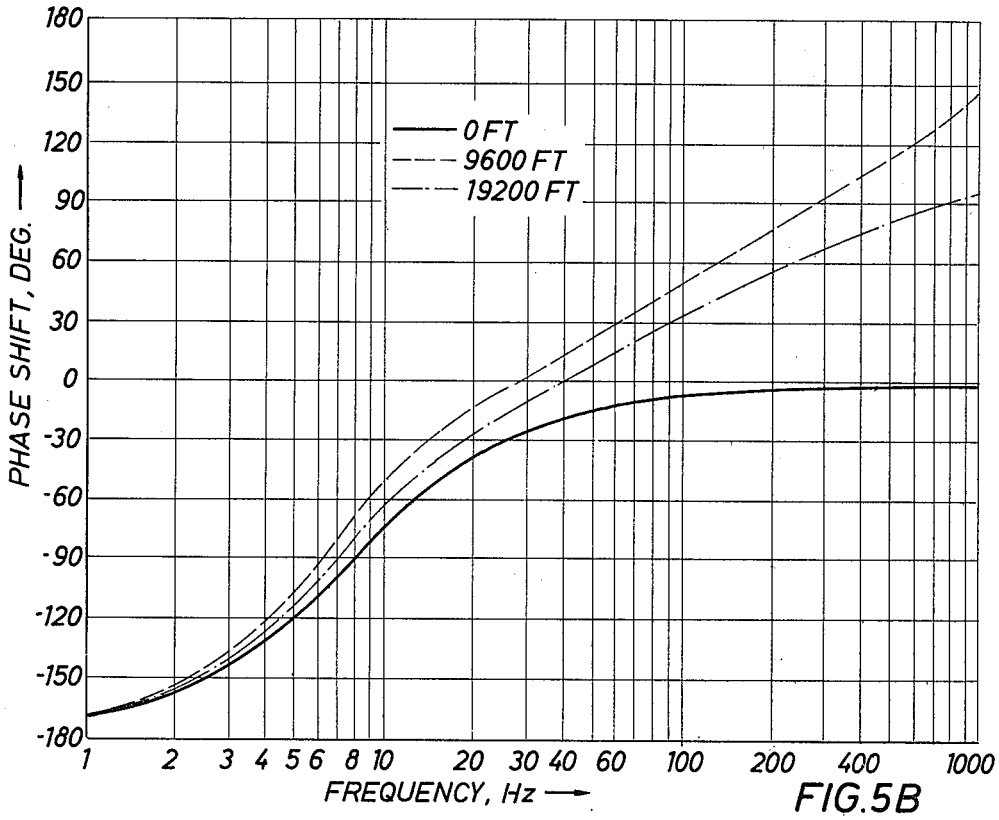

For transmission line lengths of 0 ft., 9600 ft., and 19,200 ft. with this typical voltage amplifier, the amplitude and phase responses of FIGS. 5A and 5B result. If the voltage amplifier with load impedance of 20000 ohms is replaced by a current-to-voltage converter such as S4 in FIG. 3A, the load impedance ZL becomes zero, so voltage V2 must also be zero. However, one can make the output voltage VOUT proportional to the load current I by proper selection of the transfer resistance RT. For instance, by setting the sum of R1A and R1B of FIG. 3A equal to 1000 ohms and by setting the gain of operational amplifier B1 at 2.5, transfer resistance RT becomes 2500 ohms and the amplitude and phase response of FIGS. 6A and 6B result. In this example, a value of 2500 ohms is chosen so that the respective responses of FIGS. 5A and 6A approach zero decibels for a zero length transmission line.

Figure 6A:
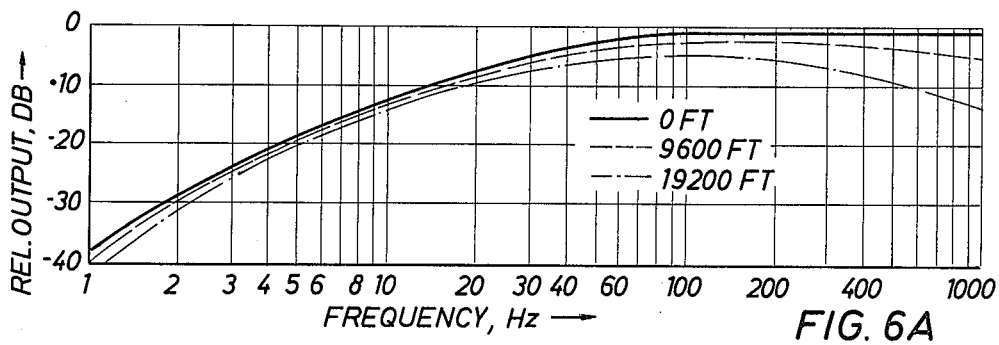
FIGS. 6A and 6B are the amplitude and phase responses of the geophone station when attached to a current-to-voltage converter of the invention.
Figure 6B:
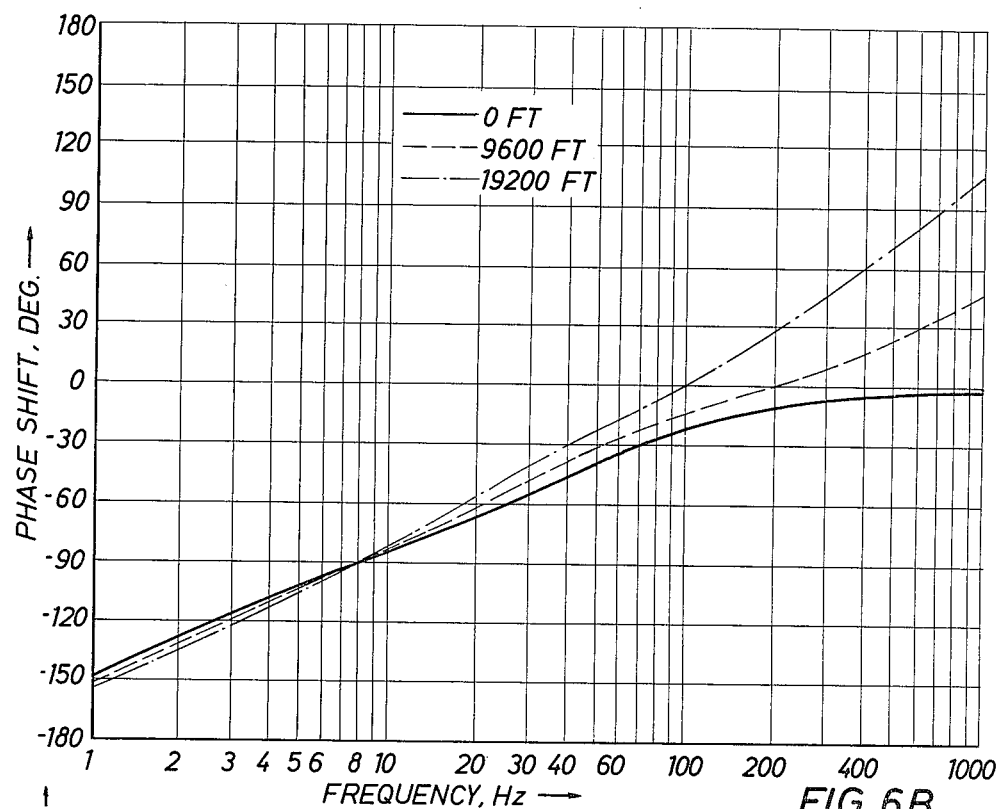

For some seismic surveys, especially high resolution surveys utilizing high frequency components above 100 Hz, the responses as shown in FIGS. 6A and 6B will be preferred to those shown in FIGS. 5A and 5B. In particular, for transmission line lengths from 0 feet to 19200 feet, the maximum difference in phase shift in FIG. 6B at 100 Hz amounts to no more than 22 degrees, whereas the phase shift difference can exceed 57 degrees at 100 Hz for FIG. 5B. Likewise, the gain as shown in FIG. 5A at 100 Hz can change by more than 7 decibels between 0 feet and 19,200 feet, but the difference is no more than 3.5 decibels for FIG. 6A. In addition, because the common mode input impedance of a current-to-voltage converter like S4 can be extremely high---typically in excess of 100 million ohms---compared to only 5000 ohms for the common mode impedance of a typical voltage amplifier, the seismic survey configuration using the floating shunt current-to-voltage converter will be less sensitive to electromagnetic pickup.

Figure 7:
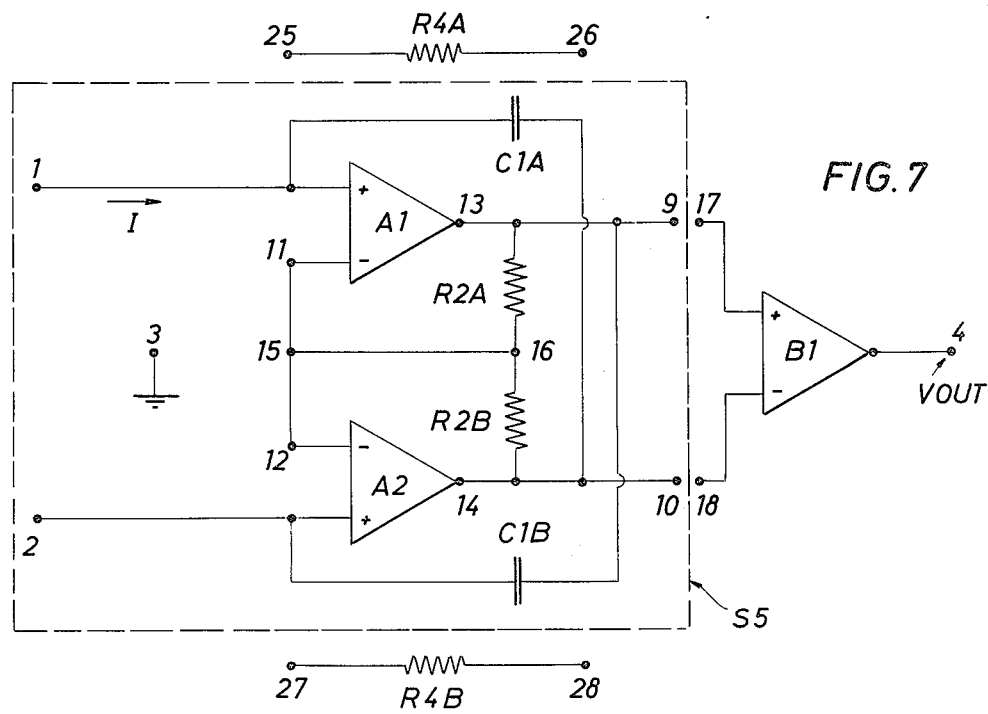
FIG. 7 is a simplified schematic of a floating shunt charge-to-voltage converter.

Another embodiment of a floating shunt amplifier is a charge-to-voltage converter, or charge amplifier, as shown in FIG. 7. The feedback configuration of amplifier S5 shown in FIG. 7 is identical to that shown for amplifier S1 in FIG. 1, but resistances R2A and R2B are substituted for impedances Z2 and Z3 respectively, and capacitances C1A and C1B are substituted for impedances Z1 and Z4 respectively. It is possible to select R2A=R2B and C1A=C1B so that the output voltages will be complementary with respect to VCM. By connecting the output terminals 9 and 10 of amplifier S5 to the input terminals 17 and 18 of a voltage amplifier B1 with a high common mode voltage rejection ratio, a single-ended output voltage VOUT can be generated at output terminal 4 of amplifier B1 which is proportional to the charge transferred from input terminal 1 to input terminal 2 of amplifier S5. The charge-to-voltage converter S5 can be applied very much like the current-to-voltage converter S3 of FIG. 3A except that the output voltage is proportional to the charge or time integral of the input current rather than being proportional to the input current itself. Amplifiers S3 and S5 are virtually indistinguishable with respect to their input terminals and Ainput impedances.

In actual field applications with real operational amplifiers substituted for the ideal operational amplifiers A1 and A2, the outputs of the charge-to-voltage converter S5 will tend to drift at very low frequencies due to the integration of small bias currents flowing at the positive polarity input terminals 1 and 2. One means of stabilizing the charge-to-voltage converter S5 at very low frequencies is to connect resistances R4A and R4B in parallel with capacitances C1A and C1B respectively. It is usually possible to select a value for resistances R4A and R4B that is much larger than the impedances of capacitances C1A and C1B within a desired frequency passband. At very low frequencies below the desired frequency passband, the impedances of capacitances C1A and C1B will become larger than resistance R4A and R4B, and the high frequency charge-to-voltage converter response of S5 will gradually change into a low frequency current-to-voltage converter response.

One application of a charge-to-voltage converter such as S5 is an input amplifier for a marine seismic survey recording insturment. Referring again to FIG. 4A, the geophone station can be replaced with a hydrophone station composed of one or more hydrophone transducers and a coupling network which may be contained within a marine seismic cable. The hydrophone station generates an output voltage at terminals 1 and 2 which are connected respectively to terminals 3 and 4 at the input of a transmission line contained witnin a marine seismic cable. Terminals 5 and 6 are the output terminals of the transmission line and they are connected respectively to the input terminals 7 and 8 of a seismic amplifier S4 which generates an output voltage at terminal 9. Terminal 10 is the ground or reference terminal for the seismic survey recording instrument. Each of the terminal pairs can be associated with an equivalent electrical network as shown in FIG. 4B. If a transformer is used to couple the hydrophone transducers to the transmission line, the equivalent network of the hydrophone station may have the same electrical circuit as described for the geophone station in FIG. 4B. If the transformer is not used, then the euqivalent network should be modified by ommitting inductance L7 in parallel with resistance R7. For a hydrophone station, the ideal voltage source will be directly proportional to the local acoustic pressure rather than the partical velocity. Typical values for a given field configuration of a hydrophone station without a transformer are: C5, C6 = 1.0 microFarad, R7 = 10 Megohm, L2, L3 are negligible, R5, R6 are negligible. In many cases, the entire hydrophone equivalent circuit can be represented by capacitances C5 and C6 in series with the ideal voltage source. The rest of the equivalent circuit may have a negligible effect on the total response. A typical transmission line used for marine seismic surveys has a distributed series resistance of 0.2 ohms/ft, a distributed shunt capacitance of 33 picoFarads/ft, and negligible values for the distributed shunt conductance and the distributed series inductance. The load impedance of a charge-to-voltage converter like S5 in FIG. 7 will be nearly zero. However, the output voltage VOUT will be proportional to the time integral of the load current I. Within a desired passband of approximately 10 Hz to 500 Hz a value of 0.5 microFarads can be achieved for the integrating capacitance of amplifier S5 by selecting C1A = C1B = 1.0 microFarads. It is convenient but not necessary for C1A and C1B to be equal in value. If capacitances C1A and C1B are chosen to be equal one may select R2A = R2B = 10000 ohms. The value of the resistances R4A and R4B in parallel with the capacitances can be selected to be equal to the impedance of the 1.0 microFarad capacitance at some lower frequency, for instance 2.0 Hz. In this case, R4A = R4B = 79.5 Kohms. For transmission line lengths of 0 feet, 6000 feet and 12000 feet, FIG. 8A and 8B depict the amplitude and phase responses of the hydrophone circuit utilizing a charge-to-voltage amplifier such as S5 of FIG. 7.

The response shown is also typical of the response from a differential charge amplifier of the type described in U.S. Pat. No. 3,939,468 issued to Mastin, whenever the same values of 1.0 microFarad and 79.5 Kohms are used for the parallel capacitive-resistive combination in the feedback loops. However, the Mastin circuit has a very low common mode input impedance, so it will be more sensitive to electromagnetic pickup than the improved floating shunt charge-to-voltage converter, S5, constructed with the present invention. The balanced charge amplifier circuit proposed by Hoffman et al, in U.S. Pat. No. 3,469,255 also has a very low common mode input impedance, and is likewise sensitive to electromagnetic pickup.

Figure 8A:
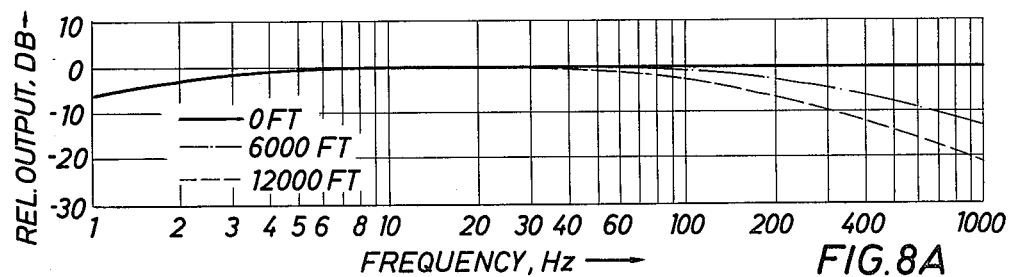
FIGS. 8A and 8B are amplitude and phase responses of a hydrophone station when attached to a charge-to-voltage converter of the invention.
Figure 8B:
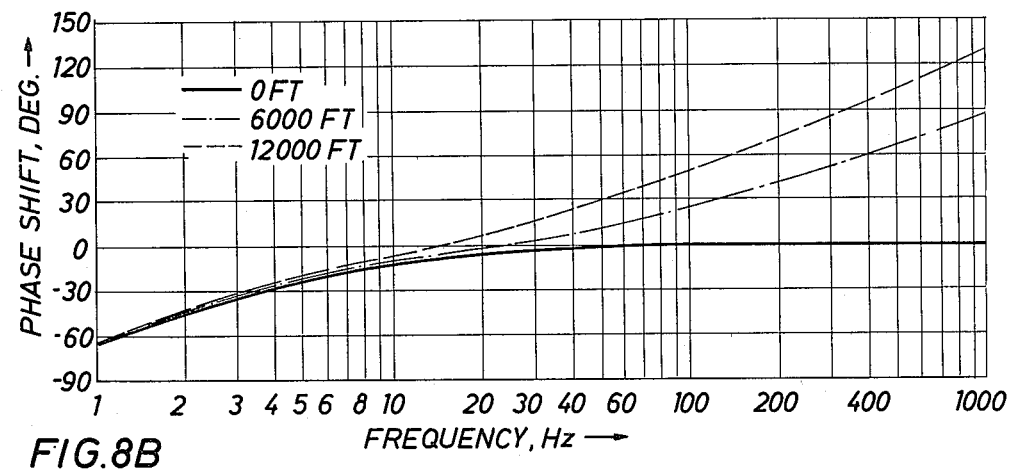

Rather than allowing the hydrophone station frequency response function to vary with the length of the transmission line, as shown in FIGS. 8A and 8B, it is possible to use the transfer impedance response function of the floating shunt amplifier to compensate for the effect of a transmission line when it is attached between a transducer station such as a hydrophone and the inputs of a floating shunt amplifer. In other words, the ratio of the input current of the seismic amplifier to its output voltage (a transfer admittance) can be made proportional to the ratio of the input current of the seismic amplifier to the output of the transducer's ideal voltage source (another transfer admittance). If the proportionality is made equal to a real constant within a desired frequency passband, then the amplitude and phase responses will be constant in magnitude and have a zero degree phase shift within the approximations of the equivalent circuits used for design.

Figure 15:
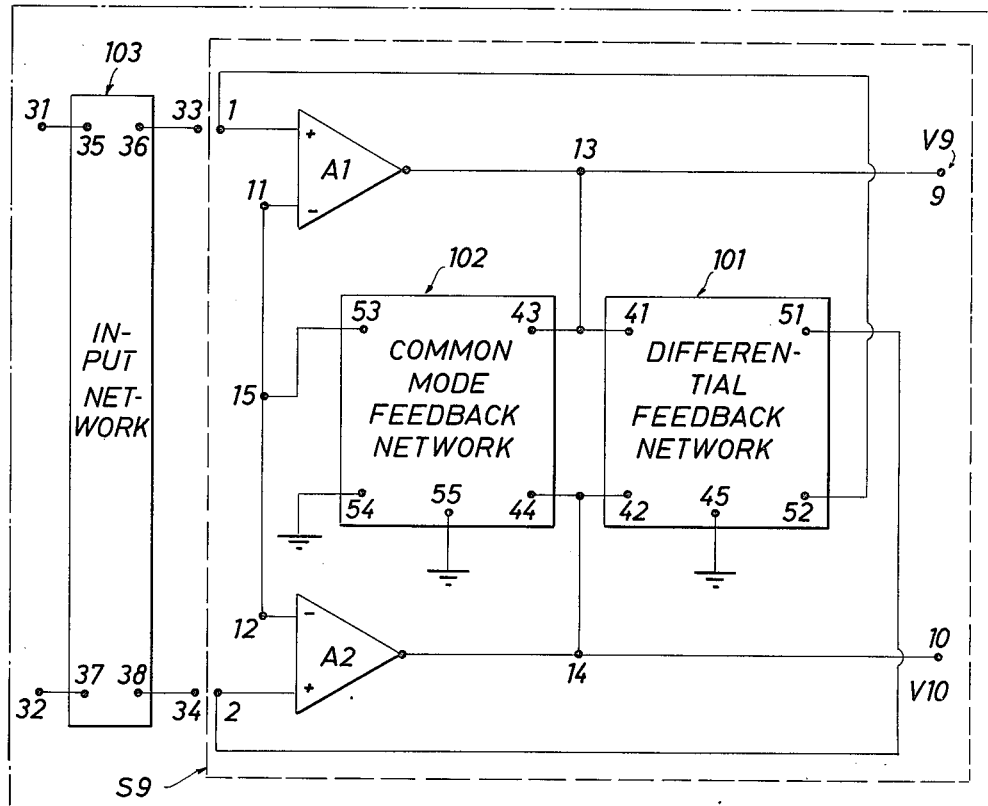
FIG. 15 is a simplified schematic of a floating shunt amplifer and an input network comprising a floating shunt voltage amplifier.

A seismic amplifier embodying this concept is depicted in FIG. 15. Amplifier S9 is comprised of operational amplifiers A1 and A2 interconnected by feedback networks 101 and 102. Positive input terminals 1 and 2 of amplifiers A1 and A2 respectively, become the seismic amplifier input terminals. Output terminals 13 and 14 of amplifiers A1 and A2 become the seismic amplifier output terminals 9 and 10 respectively. Differential feedback network 101 has input terminals 41 and 42 connected to the output terminals 13 and 14 of operational amplifiers A1 and A2, respectively. Differential feedback network output terminals 51 and 52 are connected to positive input terminals 2 and 1 of operational amplifiers A2 and A1, respectively. The transfer impedance of amplifier S9 of FIG. 15 becomes the reciprocal of the forward transfer admittance of network 101 with a voltage equal to the difference between V9 and V10 applied at input terminals 41 and 42 and a zero impedance connecting output terminals 51 and 52. This transfer admittance, which is the ratio of output current to input voltage, may be achieved through the use of active elements, passive elements, or a combination of both. The forward transfer admittance may be a complex number, and in order to insure low frequency stability, the real part should remain positive as the frequency approaches zero. Common mode feedback network 102, which is necessary to maintain a high common mode impedance, has input terminals 43 and 44 connected to output terminals 13 and 14 of operational amplifiers A1 and A2. Output terminal 54 of network 102 is connected to the signal common or reference point of seismic amplifier S9. Output 53 of network 102 is connected to circuit node 15 which is connected to negative input terminals 11 and 12 of operational amplifiers A1 and A2, respectively. The response of common mode feedback network 102 is defined in terms of the response of differential feedback network 101 as follows: as the values of voltages V9 and V10 vary with respect to one another, the voltage at terminal 53 will be equal to the voltage at either terminal 51 or 52 when terminals 51 and 52 are at the same voltage and a current may be flowing between terminals 51 and 52. Under this constraint, feedback network 102 will maintain negative input terminals 11 and 12 of amplifiers A1 and A2 at the same common mode voltage as appears at positive input terminals 1 and 2. If feedback network 101 is unbalanced with respect to ground terminal 45, feedback network 102 must exhibit a similar unbalance with respect to ground terminal 55. Of course, it is recognized that active elements, passive elements, or a combination of both may be utilized to achieve the proper relationship of common mode feedback network 102 to differential feedback network 101. As long as the gains of amplifiers A1 and A2 are much greater than unity, the differential input voltage between terminals 1 and 2 will be much smaller than the maximum output voltages V9 or V10, consequently the differential input impedance will be much smaller than the transfer impedance of amplifier S9 of FIG. 15. In most cases, the value of the differential input impedance will be negligible. In addition, proper selection of networks 101 and 102 will provide an amplifier with a high common mode input impedance.

Figure 9A:
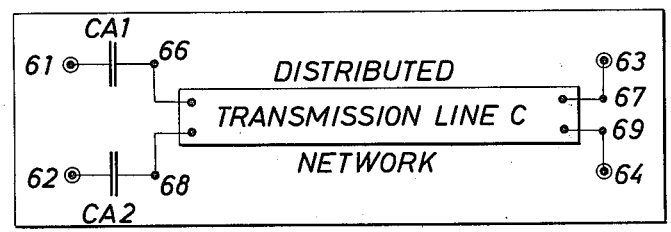
FIGS. 9A, 9B and 9C are representations of various feedback networks with approximately the same transfer admittances.

In order to develop an appropriate set of feedback impedances to use as network 101 of the floating shunt amplifier design in FIG. 15 that has been broadly described, one may consider the distributed two-port network shown in FIG. 9A. The input terminals of this network are labeled 61 and 62 and the output terminals are labeled 63 and 64. A capacitance CA1 is connected between terminal 61 and node 66. Another capacitance CA2 is connected between terminal 62 and node 68. Nodes 66 and 68 are connected to the input of a distributed transmission line whose outputs are connected to nodes 67 and 69 which in turn are connected respectively to output terminals 63 and 64. When an ideal voltage source is connected between terminals 61 and 62, there results a very precise equivalent electrical circuit for a transmission line attached to a simple hydrophone station that has a very large value for the shunt resistance R7 discussed earlier. The output current flowing from terminal 63 to 64 through a zero impedance shunt can be evaluated by multiplying the input voltage times the transfer admittance of the network.

Figure 9B:
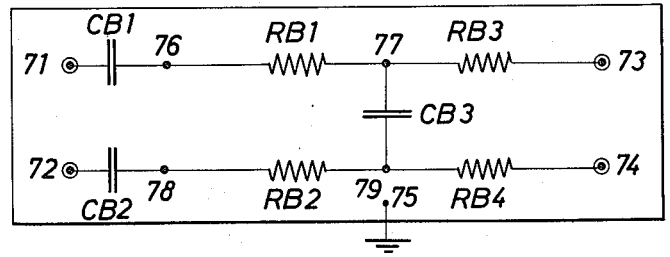

Referring to FIG. 9B, the network shown therein can be described as follows: Input terminals are designated 71 and 72 and output terminals are designated 73 and 74. Capacitance CB1 is connected between terminals 71 and node 76, and capacitance CB2 is connected between terminals 72 and node 78. A balanced-T configuration comprised of resistance RB1, RB3, RB2 and RB4 and capacitance CB3 connects nodes 76 and 78 with ouput terminals 73 and 74, respectively. This network can be much more compact than the distributed network of FIG. 9A, but it may result in a less precise equivalent electrical circuit for a transmission line when attached to a simple hydrophone station.

Figure 9C:
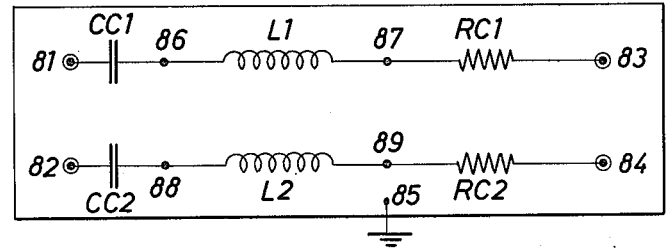

Referring to FIG. 9C, a third lumped parameter network is shown, wherein input terminals are designated 81 and 82, and output terminals are designated 83 and 84. Two series RLC circuits consisting of capacitances CC1 and CC2, inductances L1 and L2, and resistances RC1 and RC2 connect inputs 81 and 82 to outputs 83 and 84, respectively. Using the network in FIG. 9C, a frequency-compensated seismic amplifier can be constructed with the basic floating shunt amplifier S1 in FIG. 1, since no cross-coupling is present between the two series RLC circuits. One RLC circuit may be substituted for impedance Z1 in feedback loop 7, and the other RLC circuit may be substituted for impedance Z4 in feedback loop 8. Such a floating shunt amplifier circuit can compensate within a desired frequency passband for the varying lengths of transmission line between a hydrophone station and the floating shunt amplifier input terminals. By scaling the impedance values of all the feedback elements in each loop by a positive real number, an amplifier with an overall gain other than unity may be constructed.

The ratio of the transfer admittance of the network of FIG. 9A to the transfer admittance of the network of FIG. 9C can be evaluated for the following specific parameters: CA1=CA2=CC1=CC2=1.0 microFarads, and a transmission line length of 12000 feet with a distributed series resistance of 0.2 ohms/ft, a distributed shunt capacitance of 33 picoFarads/ft. RC1=RC2=425.2 ohms, L1=L2=0.28512Henery.

Figure 10A:
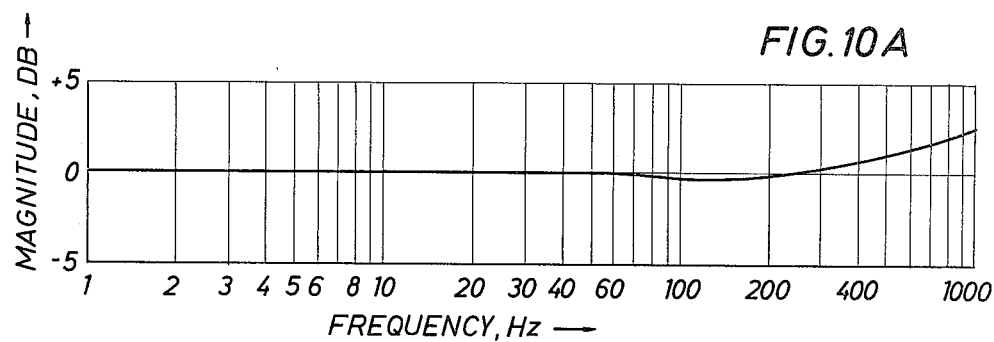
FIGS. 10A and 10B are comparisons of amplitude and phase responses of the network shown in FIG. 9A with the networks in FIGS. 9B and 9C.
Figure 10B:
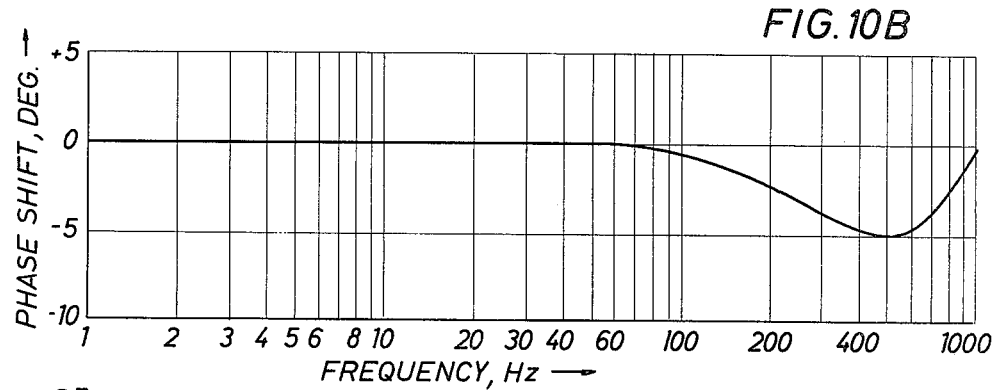

The resulting ratio is displayed in FIGS. 10a and 10B expressed in terms of its magnitude; FIG. 10A in decibels and its differential phase shift, FIG. 10B, in degrees. From, 1 Hz to 500 Hz the two transfer admittances are proportional to each other within 0.75 decibels in magnitude and 5 degrees in phase. Within reasonable approximation, the proportionality is equal to a real constant of unity for frequencies between 1 Hz and 500 Hz. For transmission line lengths shorter than 12000 feet the proportionality can be made to approach a real constant even more precisely.

The network of FIG. 9B can be distinguished from the network of FIG. 9C by external measurements. For example, if an ideal voltage source is connected from terminal 71 to ground terminal 75 of the network of FIG. 9B and terminals 72 and 73 are left open-circuited, then a finite output current can flow through a zero impedance shunt connected from terminal 74 to ground terminal 75. However, if a similar measurement is performed on the network of FIG. 9C with a voltage applied between terminals 81 and 85, no current can flow in a zero impedance branch from terminal 84 to ground terminal 85. Nevertheless, with the proper choice of component values, the two-port (dual input-dual output) transfer admittance between the input terminals and the output terminals can be made identical in value for both of the networks. For the particular components chosen for the network of FIG. 9C, the following values result in an identical value for the transfer admittance at all frequencies: CB1=CB2=1.0 microFarad, RB1=RB2=Rb3=RB4=600 ohms, CB3=0.396 microFarads. The capacitance CB3 of the network of FIG. 9B is equal to the sum of the distributed capacitance of 12000 feet of the transmission line network of FIG. 9A. Likewise, the sum of the four resistances in FIG. 9B is equal to the sum of the distributed resistance of the same 12000 feet of transmission line. The network of FIG. 9B is a balanced-T equivalent circuit which closely approximates the response of a transmission line and hydrophone station at low frequencies. Because the two-port transfer admittances of the networks in FIGS. 9B and 9C are identical for these component values, the ratio of the transfer admittance of the network of FIG. 9A divided by the transfer admittance of the network of FIG. 9B is also displayed in FIGS. 10A and 10B.

Figure 11:
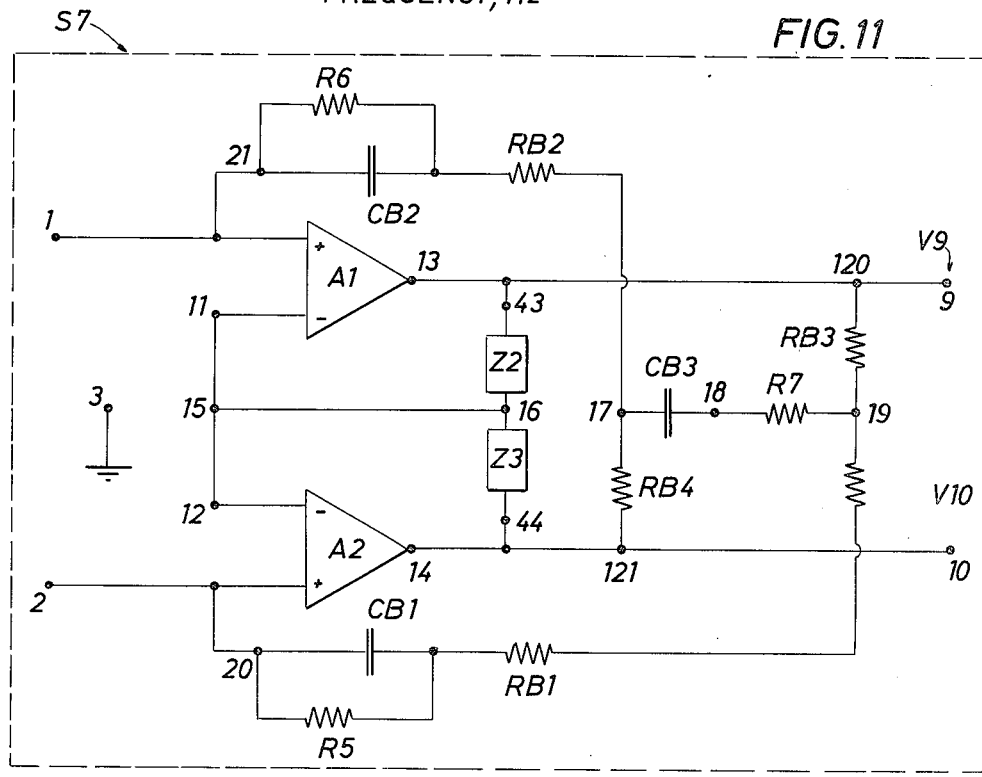
FIG. 11 is a simplified schematic of a floating shunt amplifier for compensating for the effects o a marine seismic cable transmission line and hydrophone station.

Referring to FIG. 11, there is shown a floating shunt amplifier, S7, which uses a single differential feedback network similar to the network of FIG. 9B in place of the two feed-back loops 7 and 8 of the basic floating shunt amplifier S1 in FIG. 1. Amplifier S7 has the same configuration and labeling as amplifier S1 with respect to the input and output terminals of the two operational amplifiers A1 and A2 and with respect to feedback loops 5 and 6. However, input terminals 71 and 72 of the feedback network of FIG. 9B are connected to circuit nodes 2 and 1 of FIG. 11, respectively. Output terminals 73 and 74 of the network of FIG. 9B are connected to nodes 13 and 14 of FIG. 11, respectively. It is seen, therefore, that the balanced-T equivalent circuit for a transmission line and hydrophone station has been placed in the feedback circuit of amplifier S7. Capacitances CB1 and CB2 in both FIGS. 11 and 9B can have approximately the same effect as the hydrophone station source impedance. Resistances R5 and R6 may be connected in parallel with capacitances CB1 and CB2 respectively in order to improve the low frequency stability of amplifier S7 as discussed for the charge-to-voltage converter S6 above. A resistance R7 may be disposed in series with capacitance CB3 in FIG. 11. Resistance R7 improves the high frequency stability of some operational amplifiers that may be utilized for amplifiers A1 and A2 by reducing the high frequency phase shift due to capacitance CB3. In general a value may be selected for R7 which has a negligible effect on the frequency response of amplifier S7. For instance, a value for R7 may be selected that is equal to the capacitive reactance of CB3 at 2000 Hz. Resistances R5 and R6 may be selected to be equal to the capacitive reactances of CB1 and CB2 respectively at 2 Hz, as described above.

For a gain of unity with the marine hydrophone station and cable discussed earlier, CB1=CB2=1.0 microfarad, which is twice the nominal capacitance of the hydrophone station. Each of the four resistances RB1, RB2, RB3 and RB4 are equal to one-fourth of the total series resistance of the length of transmission line between the hydrophone station and the floating shunt amplifier S7. Capacitance CB3 is equal to the distributed capacitance of the same length of said transmission line. For a transmission line length of 12000 feet, CB3=0.396 microfarads, RB1=RB2=RB3=RB4=600 ohms, R7=288 ohms, and R5=R6=79.5 kilo-ohms. For transmission line lengths shorter than 12000 feet the values of all eight of these elements will be proportionately smaller.

Figure 12B:
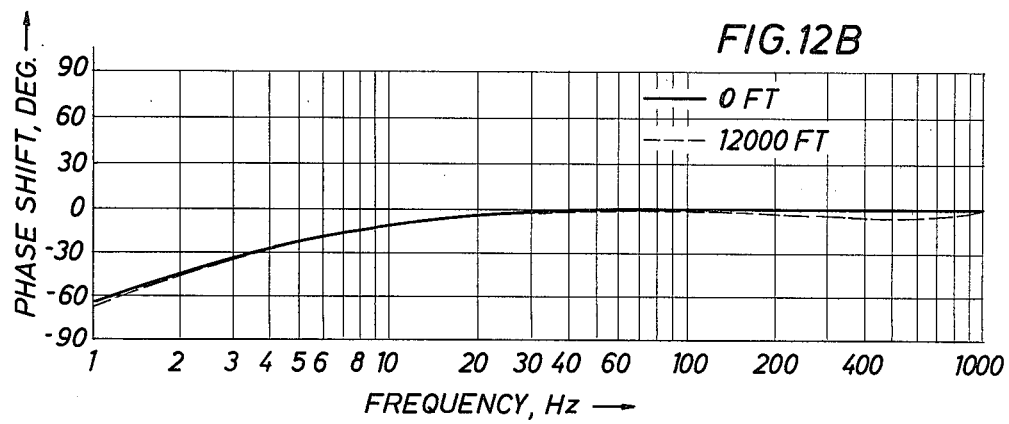
FIG. 12A and 12B are the amplitude and phase responses of a hydrophone station utilizing an amplifier of the type shown in FIG. 11.
Figure 12A:
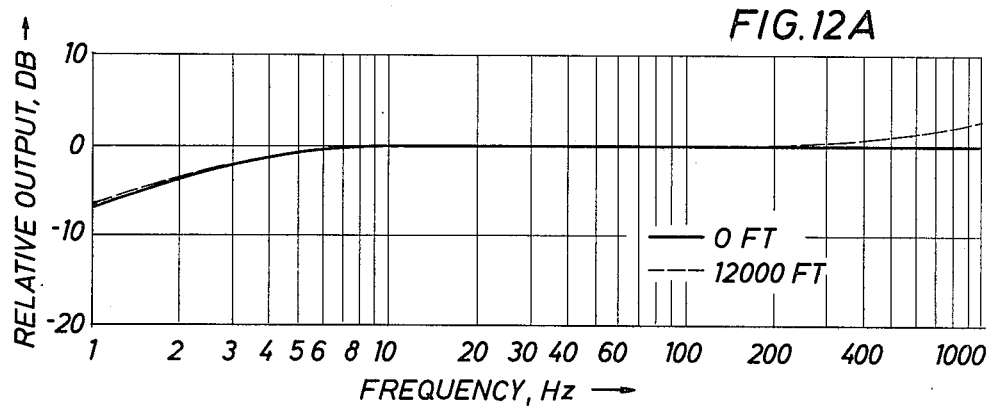

Impedances Z2 and Z3 of FIG. 11 comprise the common mode feedback network 102 of FIG. 15. Node 16 of FIG. 11 is equivalent to output terminal 53 of network 102 in FIG. 15, and nodes 43 and 44 of FIG. 11 correspond to input terminals 43 and 44 of network 102 of FIG. 15, respectively. Since a balanced differential feedback network has been specified, impedances Z2 and Z3 must be equal to each other in order to maintain the requisite balance with respect to the differential feedback network 101. Without loss of generality, one may select Z2=Z3=10000 ohms. For transmission line lengths of 0 feet and 12000 feet the ratio of the differential output voltage, (V9-V10), divided by the hydrophone transducer voltage is displayed in FIGS. 12A and 12B in terms of its magnitude, FIG. 12A, in decibels and phase shift, FIG. 12B, in degrees. From 4 Hz to more than 500 Hz the frequency response of amplifier S7 differs from unity by less than +1 decibels and less than a 30-degree phase shift regardless of the transmission line length between 0 feet and 12000 feet. This is a considerable improvement over the response function shown in FIGS. 8A and 8B for a floating shunt charge-to-voltage converter when it is connected to a variable length transmission line from the hydrophone station.

Figure 13:
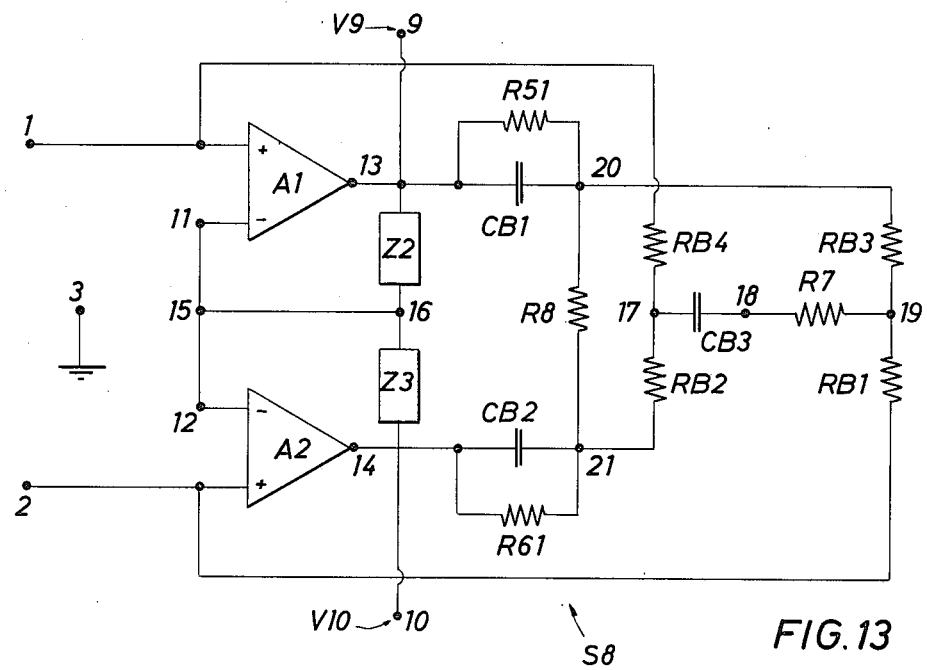
FIG. 13 is a simplified schematic of a floating shunt amplifier for compensating for the effects of a geophone station and transmission line.

A floating shunt amplifier can also be designed to compensate for the effects of a transmission line connected to a geophone station. Referring to FIG. 13, amplifier S8 has the same configuration and labeling as amplifiers S1 and S7 with respect to the input and output terminals of the two operational amplifiers A1 and A2 and with respect to feedback loops 5 and 6. However, feedback loops 7 and 8 are replaced by a single differential feedback network as follows: A capacitance CB1 is connected between output terminal 13 of amplifier A1 and circuit node 20. Resistance RB3 connects circuit nodes 20 and 19. Resistance RB1 connects circuit node 19 and positive input terminal 2 of amplifier A2. In a similar manner another capacitance CB2 is connected between output terminal 14 of amplifier 2 and circuit node 21. Resistance RB2 connects circuit node 17 and positive input terminal 1 of amplifier A1. Circuit nodes 17 and 19 are connected together by a capacitance CB3 in series with an optional resistance R7. Resistances RB1, RB2, RB3 and RB4, together with capacitance CB3 can be used as a balanced-T equivalent circuit for the geophone station transmission line. However, it is even more convenient if resistances RB3 and RB4 are augmented to include the effect of the resistance of the geophone coil represented by resistances R5 and R6 in the geophone equivalent circuit shown in FIG. 4. A resistance R8 is connected between circuit nodes 20 and 21 in FIG. 13 and has approximately the same effect as the transducer shunt resistance R7 in the geophone equivalent circuit in FIG. 4B. Likewise, the capacitances CB1 and CB2 can have approximately the same effect as the geophone equivalent capacitances C5 and C6 in FIG. 4B. The inductances L7, L2 and L3 from the geophone equivalent circuit have been omitted from the feedback circuit of amplifier S8 because they are inconvenient to place on a small printed circuit board and because even without them, the resulting transfer impedance response function is an acceptable approximation of the desired response function within a frequency passband of 7 Hz to 300 Hz. Resistances R51 and R61 may be connected in parallel with capacitances CB1 and CB2 respectively, in order to improve the low frequency stability of amplifier S8 as discussed for amplifier curcuits S7 and S6. Likewise, the resistance R7 can be used to improve the high frequency stability as discussed for amplifier S7. For instance, a value for R7 may be selected that is equal to the capacitive reactance of CB3 at 2000 Hz. Resistances R51 and R61 may be selected to be equal to the capacitive reactances of CB1 and CB2 respectively at 2 Hz. Again, one can select Z2=Z3=10000 ohms.

Figure 14A:
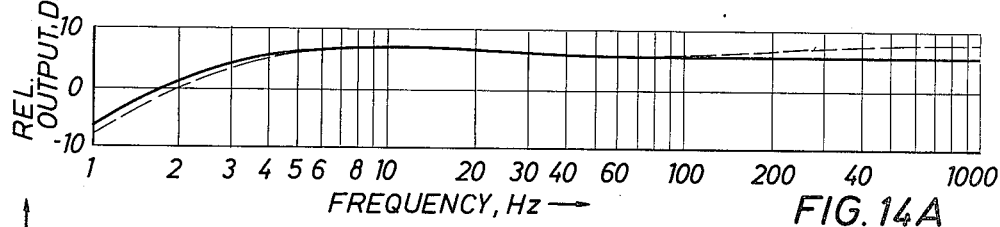
FIGS. 14A and 14B are the amplitude and phase responses of a geophone station utilizing an amplifier of the type shown in FIG. 13.
Figure 14B:
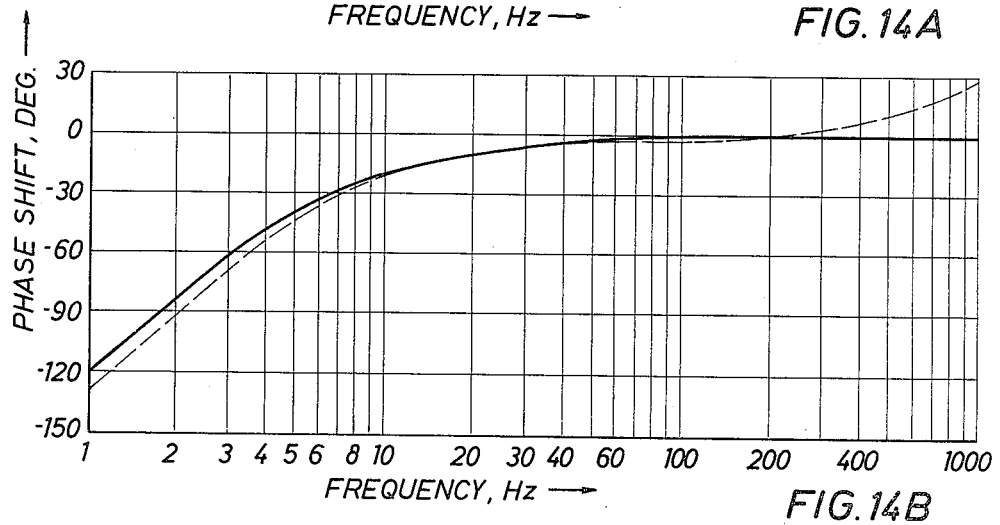

Instead of selecting a gain of unity, amplifier S8 may be specified for a gain of 2.0 (6.0 decibels) within the desired passband. With the geophone station and cable discussed earlier, the properly scaled values for the feedback elements are CB1=CB2=1.8 microfarads, and R8=19200 ohms. Resistances RB1 and RB2 are each equal to one-half of the total series resistance of the length of transmission line between the geophone station and the floating shunt amplifier S8. Resistances RB3 and RB4 are each equal to the value of RB1 plus the total coil resistance 2880 ohms. Capacitance CB3 is equal to one-half the distributed capacitance of the same length of the transmission line attached to the geophone. For a transmission line length of 19200 feet and a gain factor of 2.0CB3=0.48microfarads, RB1=RB2=634ohms, RB3=RB4=3514ohms, R7=198ohms, and R5=R6=45.67 kilo-ohms. For transmission line lengths shorter than 19200 feet the values of all eight of these elements will be proportionately smaller. For transmission line lengths of 0 feet and 19200 feet the ratio of the differential output voltage, (V9-V10), divided by the geophone transducer voltage is displayed in FIGS. 14A and 14B in terms of its magnitude, FIG. 14A in decibels and its phase shift, FIG. 14B, in degrees. From 7 Hz to approximately 300 Hz the frequency response of amplifier S8 differs from a gain of 2.0 (6.0 decibels) by less than ±1 decibels and less than a 30-degree phase shift regardless of the transmission line length between 0 feet and 19200 feet. Once again, this is a considerable improvement over the response functions shown in FIGS. 5A and 5B and FIGS. 6A and 6B for a geophone and a variable length transmission line when connected to either a voltage amplifier or a current-to-voltage converter such as amplifier S3. The compensation for the effects of the transmission line when connected to the geophone could be made even more exact over a wider frequency passband by including elements which have the same effect as the inductances L7, L2 and L3 in the geophone equivalent circuit of FIG. 4B, but the response function shown in FIGS. 14A and 14B is usually adequate and requires fewer components in the feedback network.

Referring again to FIG. 15, a floating shunt voltage amplifier S10 is shown. Voltage amplifier S10 is comprised of input network 103 and floating shunt amplifier S9, as described above. Output terminals 33 and 34 of network 103 are connected to positive input terminal 1 and 2 of operational amplifiers A1 and A2, respectively. Terminals 31 and 32 become the input terminals for voltage amplifier S10.

The effect of the input network 103 is to convert an input voltage between input terminals 31 and 32 into a known output current function flowing through a low impedance path provided between terminals 1 and 2 of floating shunt amplifier S9. The voltage gain of amplifier S10 is equal to the product of the forward transfer admittance of network 103 and the transfer impedance of floating shunt amplifier S9. The differential driving point impedance of S10 will be equal in value to the reciprocal of the driving point admittance of the input network 103, when its output terminals are connected together with a zero impedance branch.

Figure 16:
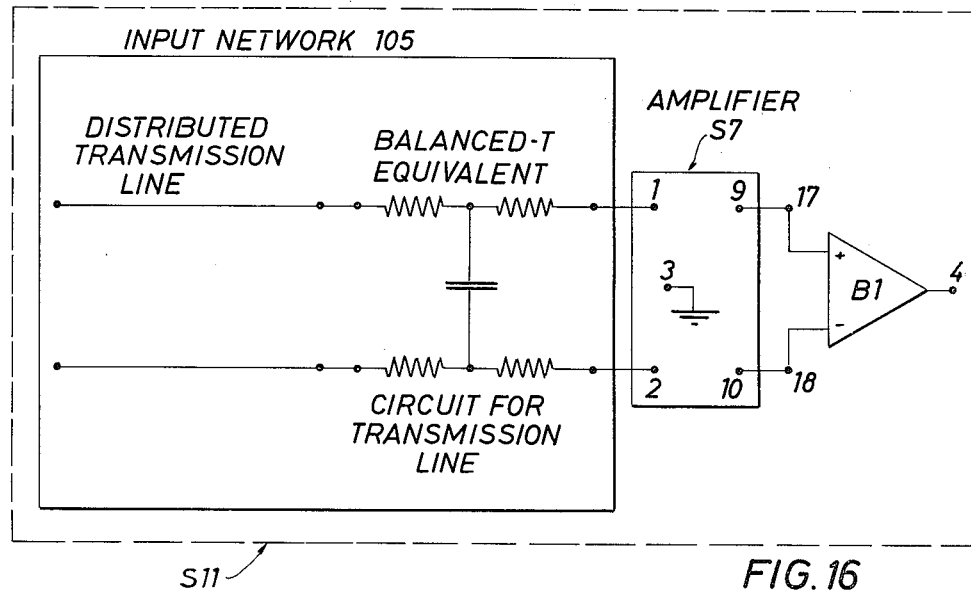
FIG. 16 is a simplified schematic of a floating shunt voltage amplifier with a specific input network to be used in marine seismic surveying.

The usefulness of such an input network can be illustrated with reference to FIG. 16. Input network 105 shown therein comprises a length of marine seismic cable transmission line of the type described earlier cascaded with a balanced-T equivalent network for the same transmission line. The combined effect of this network approximates the effect of the longest length actual transmission line being used, for instance 12000 feet, in a group of recording channels of a particular marine seismic survey recording instrument. The output terminals of input network 105 in FIG. 16 are connected to the input terminals of amplifier S7. Floating shunt amplifier S7 is identical to the amplifier of the same designation described in FIG. 11 for a transmission cable pair length of 12000 feet. The amplifier feedback circuits, networks 101 and 102 of FIG. 15, are therefore invariant. The common mode voltage response of floating shunt amplifier S7 can be eliminated by cascading amplifier S7 with a differential voltage amplifier B1 which has a high common mode voltage rejection ratio. Values may be selected for the input networks and feedback networks of the floating shunt voltage amplifier such that the common mode input impedance is very high, thereby reducing sensitivity to VLF elecromagnetic pickup. In addition, the differential voltage gain of a floating shunt amplifier with such an input network is not dependent upon how well balanced the input network is with respect to the ground terminal.

The advantage of utilizing an input network arises because common mode feedback network 102 and differential feedback network 101 of FIG. 15 may remain the same for all amplifier channels. Only the input networks are varied, as the physical lengths of the transmission lines are changed, thus allowing more efficient manufacture and maintenance of the component parts. In addition, both the voltage gains and the driving point inpedances at the transducer ends of the transmission lines remain nearly constant from channel to channel.

The foregoing disclosure and description of the various embodiments of the invention is illustrative and explanatory thereof, and various changes in circuit configuration, impedances and combinations of impedances, may suggest themselves to those skilled in the art and may be made within the scope of the appended claims without departing from the spirit of the invention.

I claim:

1. A floating shunt amplifier comprising:
   two operational amplifiers, each amplifier having positive and negative polarity inputs and an output;
   two feedback loops electrically connected to said operational amplifiers, a first feedback loop connecting the output of a first operational amplifier to the positive polarity input of the second operational amplifier, the second feedback loop connecting the output of the second operational amplifier to the positive polarity input of the first operational amplifier, each of said feedback loops including an impedance serially disposed therein; and,
   means connected to said negative polarity inputs of said operational amplifiers for maintaining said negative polarity inputs at the common mode input potential of said floating shunt amplifier.

2. A floating shunt amplifier according to claim 1, wherein said means connected to said negative polarity inputs comprises two negative feedback loops, in which two impedances are connected in common at a first terminal, the second terminals of said impedances each being connected to one of said outputs of said operational amplifiers, said first terminals which are connected in common being connected to both of said negative polarity inputs.

3. A floating shunt amplifier according to claim 1, wherein said impedances serially disposed in said feedback loops comprise capacitances, such that said floating shunt amplifier functions as a charge amplifier.

4. A floating shunt amplifier according to claim 3, including a resistance connected in a parallel configuration with each of said capacitances.

5. A floating shunt amplifier according to claim 1, wherein said impedances serially disposed in said feedback loops comprise resistances, such that said floating shunt amplifier functions as a current-to-voltage converter.

6. A floating shunt amplifier according to claim 1, including a differential voltage amplifier having negative and positive polarity inputs and an output, wherein said negative and positive polarity inputs are connected to said operational amplifier outputs, such that common mode signals appearing at said operational amplifier outputs are completely cancelled.

7. A floating shunt amplifier according to claim 1, wherein said impedance serially disposed in said first feedback loop is a capacitance, said impedance serially disposed in said second feedback loop is a resistance, said means connected to said negative polarity inputs comprise two negative feedback loops, in which a capacitance and a resistance are connected in common at a first terminal, the second terminal of said resistance being connected to said second operational amplifier output, the second terminal of said capacitance being connected to said first operational amplifier output, and including:
   a first and second differential voltage amplifier, each amplifier having positive and negative polarity inputs and an output;

a series configuration of a resistance and a capacitance disposed between said differential voltage amplifier positive inputs, said resistance and capacitance having a common terminal;

means connecting said last-mentioned common terminal to both of said differential voltage amplifier negative terminals; and, means connecting said first operational amplifier output to said first differential voltage amplifier positive input, and said second operational amplifier output to said second differential voltage amplifier positive input, respectively.

8. A marine seismic surveying system, wherein a capacitive transducer responsive to varying acoustic pressure produces a proportional varying electrical output which is electrically coupled to a transmission line to conduct electrical signals to a processing station, comprising a seismic amplifier coupled to said transmission line, which comprises:

two operational amplifiers, each operational amplifier having a negative and a positive polarity input and an output;

a feedback circuit having a resistive-capacitive combination connecting the output of a first operational amplifier to the positive polarity input of a second operational amplifier, and a resistive-capacitive combination connecting the output of the second operational amplifier to the positive polarity input of the first operational amplifier, said feedback circuit comprising two feedback loops;

means connecting said transmission line to said positive polarity inputs of said operational amplifiers;

means connected to said negative polarity inputs for maintaining said inputs at the same potential;

a series resistive-capacitive impedance electrically connecting said feedback loops to one another, whereby the resistance of said series resistive-capacitive impedance prevents oscillation of said seismic amplifier;

a differential amplifier stage having positive and negative polarity inputs and an output; and, means electrically connecting said outputs of said operational amplifiers to the positive and negative polarity inputs of said differential amplifier stage.

9. A marine seismic surveying system according to claim 8, wherein the sum of the resistances of said resistive-capacitive combination in both of said feedback loops is proportional to the transmission line series resistance, and the capacitance of said series resistive-capacitive impedance electrically connecting said feedback loops to one another is proportional to the transmission line shunt capacitance.

10. A marine seismic surveying system according to claim 8, wherein the capacitance of said resistive-capacitive combination in each of said feedback loops is proportional to twice the capacitance of said capacitive tranducer, whereby the total effect of said capacitance in both feedback loops of said seismic amplifier approximates a capacitance proportional to the capacitance of said capacitive transducer.

11. A marine seismic surveying system according to claim 8, wherein the means connected to said negative polarity inputs comprises two impedances connected in common at a first terminal, the second terminal of said impedances each being connected to one of said outputs of said operational amplifiers, said first terminals which are connected in common being connected to both of said negative polarity inputs of said operational amplifiers.

12. A marine seismic surveying system according to claim 8, including a resistance electrically connected in a parallel configuration with the capacitance of said series resistive-capacitive combination in each of said feedback loops.

13. A seismic surveying system, wherein a transducer responsive to varying acoustic wave propagation produces a proportional varying electrical output which is electrically coupled to a transmission line to conduct electrical signals to a processing station, comprising a seismic amplifier coupled to said transmission line, which comprises:

two operational amplifiers, each operational amplifier having a negative and a positive polarity input and an output;

a differential feedback network connecting the output of a first operational amplifier to the positive polarity input of a second operational amplifier, and connecting the output of the second operational amplifier to the positive polarity input of the first operational amplifier;

means connecting said transmission line to said positive polarity inputs of said operational amplifiers;

a common mode feedback network connecting said negative polarity inputs to said operational amplifier outputs, said common mode feedback network being interconnected with said differential feedback network such that a balance is maintained between both of said feedback networks with respect to ground;

a differential amplifier stage having positive and negative polarity inputs and an output; and, means electrically connecting said outputs of said operational amplifiers to the positive and negative polarity inputs of said differential output stage.

14. A seismic surveying system according to claim 13, wherein said differential feedback network comprises a four terminal network with two inputs and two outputs and including;

a series configuration of a resistance, capacitance and inductance disposed between a first input and a first output; and, a series configuration of a resistance, capacitance and inductance disposed between the second input and the second output, said first and second inputs being connected to said first and second operational amplifier outputs, respectively, said first and second outputs being connected to said second and first operational amplifier positive inputs, respectively.

15. A seismic surveying system according to calim 13, wherein said common mode network comprises a three-terminal network with two inputs and one output, a resistive impedance connecting a first input to said output, an additional resistive impedance connecting the second input to said output, said two inputs being coupled to the two inputs of said differential feedback network, said output being connected in common to the negative polarity inputs of said operational amplifiers.

16. A seismic surveying system according to claim 13, wherein said differential feedback network comprises a four terminal, two-input, two-output network and including;

a series configuration of a first capacitance, a first resistance, and a second resistance disposed between a first input and a first output;

a series configuration of a second capacitance, a third resistance, and a fourth resistance disposed between the second input and second output; and, a third capacitance interconnecting said series configurations disposed between the common terminal of said first and second resistances, and the common terminal of said third and fourth resistances, respectively, said first and second inputs being connected to said first and second operational amplifier outputs, respectively, said first and second outputs being connected to said second and first operational amplifier inputs, respective.

17. A seismic surveying system according to claim 16, wherein the sum of said first, second, third and fourth resistances is proportional to the transmission line series resistance, said third capacitance is proportional to the transmission line shunt capacitance, and each of said first and second capacitances have values proportional to twice the capacitance of said transducer.

18. A seismic surveying system according to claim 16, including a fifth resistance disposed between the common terminal of said first capacitance and said first resistance, and the common terminal of said second capacitance and said third resistance.

19. A seismic surveying system according to claim 16 or 18, includng resistances disposed in parallel with each of said first and second capacitances.

20. A seismic surveying system according to claim 16 or 18, including a resistance disposed in series with said third capacitance.

21. A seismic surveying system according to claim 18, wherein the sum of said first, second, third and fourth resistance is proportional to the sum of the transmission line series resistance and the transducer series resistance, said third capacitance is proportional to the transmission line shunt capacitance, each of said first and second capacitances have values proportional to twice the capacitance of said transducer, and said fifth resistance is proportional to the transducer shunt resistance.

22. A marine seismic surveying system according to claim 8 or 13, wherein the means connecting said transmission line to said positive polarity inputs comprises an input network for converting an input voltage into an output current function.

* * * * *